United States Patent [19]
Takeuchi et al.

[11] Patent Number: 5,831,285
[45] Date of Patent: Nov. 3, 1998

[54] SEMICONDUCTOR STATIC RANDOM ACCESS MEMORY DEVICE

[75] Inventors: Masahiro Takeuchi; Yasunobu Tokuda, both of Suwa, Japan

[73] Assignee: Seiko Epson Corporation, Tokyo, Japan

[21] Appl. No.: 587,976

[22] Filed: Jan. 17, 1996

[30] Foreign Application Priority Data

Jan. 19, 1995 [JP] Japan .................................. 7-006667
Jan. 19, 1995 [JP] Japan .................................. 7-006668
Dec. 20, 1995 [JP] Japan .................................. 7-349585

[51] Int. Cl.$^6$ ................................................ H01L 27/108
[52] U.S. Cl. ................................ 257/69; 257/67; 365/156
[58] Field of Search ........................................ 257/67, 64

[56] References Cited

U.S. PATENT DOCUMENTS

| | | | |
|---|---|---|---|
| 5,005,068 | 4/1991 | Ikeda et al. | |
| 5,239,196 | 8/1993 | Ikeda et al. | 257/385 |
| 5,363,324 | 11/1994 | Hashimoto et al. | 365/156 |
| 5,378,649 | 1/1995 | Huang | 437/52 |
| 5,436,506 | 7/1995 | Kim et al. | 257/347 |

FOREIGN PATENT DOCUMENTS

| | | |
|---|---|---|
| 0 593 247 A2 | 4/1994 | European Pat. Off. . |
| 6-5800 | 1/1994 | Japan . |

OTHER PUBLICATIONS

Nikkei Microdevice, Jun. 1991, p. 47.

International Electron Device Meeting 91, 1991, pp. 477–482.

International Electron Device Meeting 93, 1993, pp. 809–812.

1984 IEEE International Solid–State Circuits Conference, Feb. 23, 1984, pp. 226–227.

*Primary Examiner*—Olik Chaudhuri
*Assistant Examiner*—Douglas A. Wille
*Attorney, Agent, or Firm*—Oliff & Berridge, PLC

[57] ABSTRACT

A first word line connects the gate electrodes of first transfer transistors in adjacent memory cells. A second word line connects the gate electrodes of second transfer transistors in adjacent memory cells. A ground line connects the source regions of first and second driver transistors. The first and second word lines and ground line are formed by a wiring layer different from the wiring layer that forms the gate electrodes of the first and second transfer transistors. The ground line shields the first and second driver transistors, TFTs and the like. Drain contacts include chamfered sides between which the ground line is disposed.

26 Claims, 19 Drawing Sheets

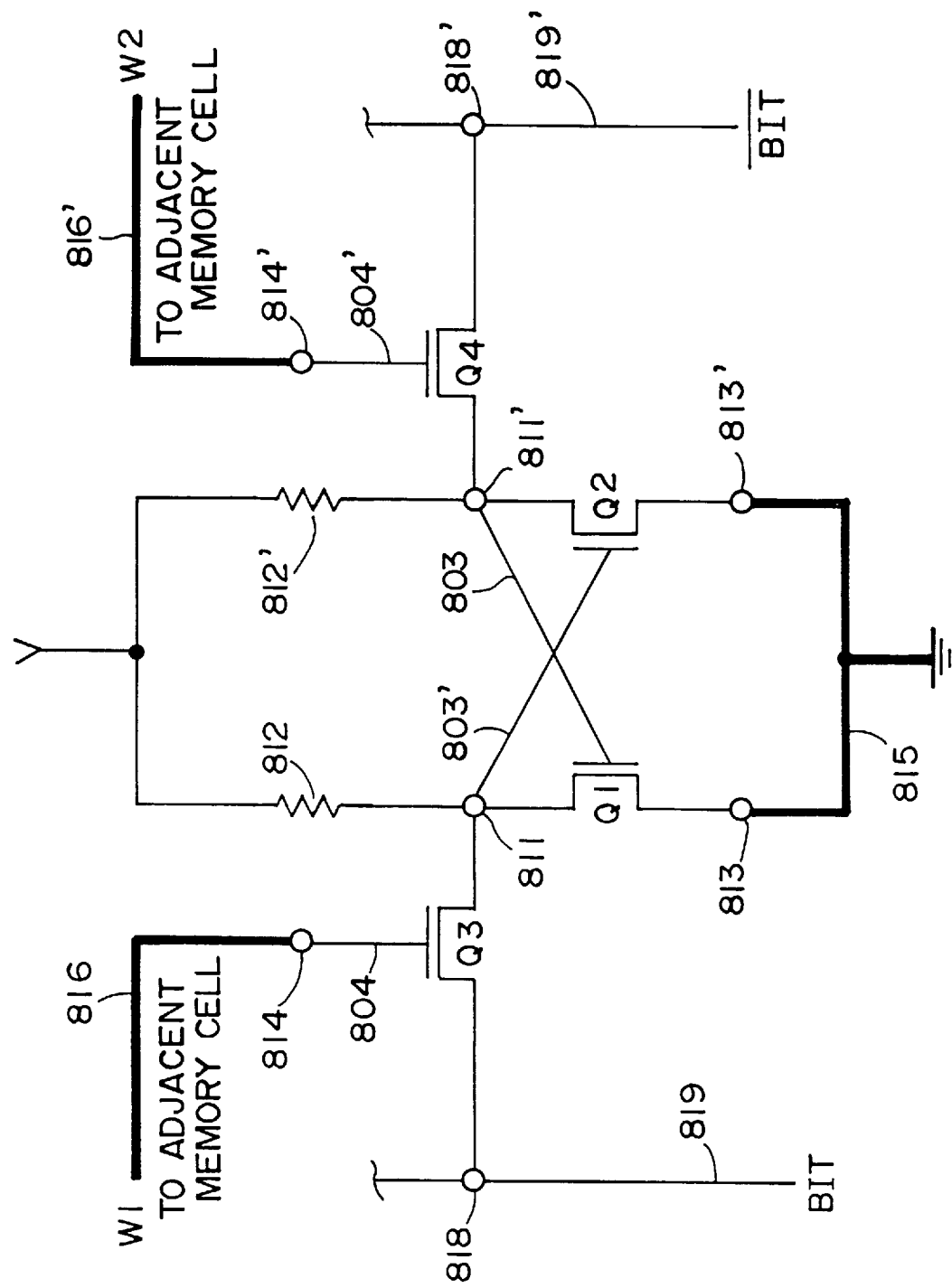

SEMICONDUCTOR STATIC RANDOM ACCESS MEMORY DEVICE

BACKGROUND OF THE INVENTION

1. Field of the Invention

The present invention relates to a semiconductor memory device and particularly to Static Random Access Memory (SRAM).

2. Description of the Related Art

The general structure of a memory cell in SRAM is shown in FIG. 21 (see "NIKKEI MICRODEVICE" June 1991, pp.47). Such a memory cell raises a problem in that it is difficult to make the memory cell into a minute structure without being greatly influenced by the bird's beak of a Local Oxidation of Substrate (LOCOS) for an element separation film. MOS transistors Q1 and Q2 constituting a flip-flop are asymmetrical with respect to their element characteristics. Such an asymmetry may become an obstacle, particularly, when the flip-flop is operated at a low voltage.

In order to overcome the above problems, there has been proposed a memory cell as shown in FIG. 22 which is known as a split word line cell (see "International Electron Devices Meeting 91" pp.482 and FIG. 1). However, such a memory cell raises a further problem in that the cell size is increased because of two word lines 404 and 404' in the memory cell.

The problem concerning increase in the cell size may be solved by a memory cell as shown in FIG. 23 which is known as a stacked split word line cell (ssw) (see "International Electron Devices Meeting 93" pp.811 and FIG. 1). Such a memory cell reduces the cell size by forming word lines 511 and 511' into a multi-layer structure. However, this type of memory cells makes it difficult to cut down the manufacturing cost, because the cell requires many manufacturing steps. Furthermore, it is difficult to increase the yield due to the need for numerous CVD $SiO_2$ deposition steps and Plasma $SiO_2$ etch-backs, which tend to produce particles.

Japanese Patent Application Laid-Open No. 6-5800 discloses another memory cell in which the gate electrodes of the transfer transistors are connected through the word lines formed in the layers other than that which forms the gate electrodes. This memory cell can achieve operational stability, because the gate electrodes of the transfer transistors are maintained at an equal potential. As shown in FIG. 24, however, a word line 522 extends across memory cell 520. Therefore, a ground line cannot be formed in the same layer as the word line 522. This raises various problems such as increase in the number of the wiring layers and manufacturing steps and degradation of the yield.

SUMMARY OF THE INVENTION

It is therefore an object of the present invention to provide a semiconductor memory device which enables improvement of the yield, reduction of the manufacturing cost, formation of a minute structure and operation at a lower voltage. Also, the present invention is geared toward providing a method of making such a semiconductor memory device.

To this end, the present invention provides a semiconductor memory device comprising memory cells each of which has a flip-flop circuit including first and second driver transistors, and first and second transfer transistors, comprising:

a first word line for connecting gate electrodes of the first transfer transistors in adjacent memory cells, and being formed by a wiring layer different from a wiring layer which forms the gate electrodes;

a second word line for connecting gate electrodes of the second transfer transistors in adjacent memory cells, and being formed by a wiring layer different from a wiring layer which forms the gate electrodes; and a ground line for connecting source regions of the first and second driver transistors, and being formed by a wiring layer identical with a wiring layer which forms the first and second word lines.

Since the gate electrodes of the transfer transistors are connected to one another through the first and second word lines in the wiring layers different from the wiring layer which forms the gate electrodes, the present invention can reduce the cell size, in contrast with the split word line cell and the like. The ground lines are formed by the same wiring layers as the first and second word lines. Therefore, the number of wiring layers can be reduced so as to decrease the number of manufacturing steps, to improve the yield and to cut down the manufacturing cost.

In such an arrangement, the wiring layers forming the first and second word lines and ground lines may be a second wiring layer located above the wiring layer forming the gate electrodes of the first and second transfer transistors.

It is desirable that the ground line covers all or part of channel areas of the first and second driver transistors, while maintaining at least a minimum spacing between the ground line and the first word line and between the ground line and the second word line. Thus, the channel areas of the first and second driver transistors can be shielded from the adverse effects and the like of the electric field. This ensures stable operation of the device and may reduce the voltage required for operation.

It is also desirable that the flip-flop circuit includes first and second load transistors or first and second load resistors, and wherein the ground line is disposed between the channel areas of the first and second load transistors and the channel areas of the second and first driver transistors or between the first and second load resistors and the channel areas of the second and first driver transistors. Thus, the first and second driver transistors can effectively be prevented from encountering the adverse effects of the electric field and the like from the second and first load transistors or second and first load resistors. Conversely, the second and first load transistors or second and first load resistors may be prevented from encountering the adverse effects of the electric field and the like from the second and first driver transistors. Such a technique is particularly effective for a memory cell in which the distance between the second and first driver transistors and the first and second load transistors or first and second load resistors is relatively short. With such a structure, it is possible to avoid the adverse effects of the electric field and the like.

According to the present invention, the flip-flop circuit may include first and second load transistors or first and second load resistors, and wherein the wiring layer forming the first and second word lines and the ground line is a third or fourth wiring layer above the first and second load transistors and load resistors. More particularly, the first and second word lines and the ground line are formed by the fourth wiring layer, when the flip-flop circuit includes the first and second load transistors. On the other hand, the first and second word lines and the ground line are formed by the third wiring layer, when the flip-flop circuit includes the first and second load resistors.

In such a case, it is desirable that the ground line covers all or part of the channel areas of the first and second load transistors or all or part of the first and second load resistors, while maintaining at least a minimum spacing between the ground line and the first word line and between the ground line and the second word line. Thus, the first and second load transistors or first and second load resistors can effectively be prevented from encountering the adverse effects of the electric field and the like from any component that is disposed above the ground line such as a bit line and the like. This ensures stable operation of the device and may reduce the voltage required for operation.

The present invention also includes an embodiment wherein the semiconductor memory device further comprises a first drain contact for connecting drain regions of the first driver and transfer transistors with the gate electrodes of the second driver transistor, and a second drain contact for connecting drain regions of the second driver and transfer transistors with the gate electrode of the first driver transistor. The first drain contact has a first chamfered side which is formed by chamfering a corner facing the second drain contact and the second drain contact has a second chamfered side which is formed by chamfering a corner facing the first drain contact.

According to the present invention, the first and second drain contacts can be disposed closer to each other while securing the necessary contact size, because they have the first and second chamfered sides. Provided that the first and second drain contacts are maintained sufficiently large in size, the resistance of the contacts can be reduced to stabilize the operation of the device and also to lower the voltage required for operation. On the other hand, the cell size can be reduced, when the distance between the first and second drain contacts is decreased. In other words, the present invention can reduce the cell size, while maintaining operational stability to some degree. In such a case, however, the word line does not necessarily connect the gate electrodes of the transfer transistors in any adjacent memory cells. The word line may connect the gate electrodes of the transfer transistors in the same memory cell.

It is further desirable that the ground line is disposed in an area between the first and second chamfered sides, and includes a side which is opposite and parallel to the first chamfered side and a side which is opposite and parallel to the second chamfered side. Thus, the aspect ratio of the ground line can be lowered to reduce the resistance thereof. This ensures stable operation and reduction of the voltage required for operation.

According to the present invention, the flip-flop circuit may include first and second load transistors; the drain regions of the first driver and transfer transistors being connected to the gate electrode of the second driver transistor through the gate electrode of the second load transistor; and the drain regions of the second driver and transfer transistors being connected to the gate electrode of the first driver transistor through the gate electrode of the first load transistor. Thus, these connections can be achieved without any wiring layer for connecting the drain regions of the driver transistors to the gate electrodes. According to the present invention, therefore, the provision of the chamfered sides of the drain contacts can increase the size thereof. Therefore, even if the drain regions are to be connected to the gate electrodes in the above manner, the resistance of the connections can be reduced to improve the yield, the reliability and the like.

The present invention includes a semiconductor memory device that further comprises a first source contact for connecting the source region of the first driver transistor to the ground line; a second source contact for connecting a source region of the second driver transistor to the ground line; a first drain contact for connecting the drain regions of the first driver and transfer transistors to the gate electrode of the second driver transistor and a second drain contact for connecting drain regions of the second driver and transfer transistors to the gate electrode of the first driver transistor; and wherein the first source and drain contacts are disposed separately with a given spacing between them in a first direction; the second source and drain contacts are disposed separately with a given spacing between them in a second direction parallel to the first direction; and the ground line is disposed in a location to include the first and second source contacts while maintaining at least a minimum spacing between the ground line and the first drain contact and between the ground line and the second drain contact.

Since the first source and drain contacts are disposed in or aligned along the first direction, and the second source and drain contacts are disposed in or aligned along the second direction, the present invention can provide contacts which are arranged compactly so as to reduce the cell size. Provided that the ground line is disposed to include the first and second source contacts and also to maintain the specified spacings between the ground line and the first and second drain contacts, the aspect ratio of the ground line can be reduced even more in the aforementioned compact contact arrangement. In other words, the present invention can decrease the resistance of the ground line, while reducing the cell size. In such a case, however, the word line does not necessarily connect the gate electrodes of the transfer transistors in any adjacent memory cells. The word line may connect the gate electrodes of the transfer transistors in the same memory cell.

The present invention includes a semiconductor memory device that further comprises a first source contact for connecting the source region of the first driver transistor to the ground line; and a second source contact for connecting the source region of the second driver transistor to the ground line; and wherein the gate electrode of the first driver transistor is angled around the first contact to maintain at least a minimum spacing between the gate electrode and respective sides of the first source contact; and the gate electrode of the second driver transistor is angled around the second source contact to maintain at least a minimum spacing between the gate electrode and respective sides of the second source contact.

When the gate electrodes are angled around the source contacts, the effective width in the gate electrodes can be made greater to increase the β ratio in the memory cell. Furthermore, it is possible to provide chamfered sides on the active area to reduce the cell size.

It is further desirable that the gate electrodes of the first and second driver and transfer transistors are formed of silicon film, and wherein the first and second word lines and the ground line are formed of a material different from the silicon film. Thus, the gate electrodes are not necessarily made of polycide and the like; the process can be shortened and the yield can be improved. Desirably, the word, ground and other lines are formed of any one of such materials as the high-melting metal polycides, high-melting metal suicides, and metals.

It is further desirable that the memory cells are disposed in linear symmetry about a boundary between adjacent memory cells, and wherein the gate electrodes of the first transfer transistors in adjacent memory cells are formed into a first island-like configuration, which is shared by the gate electrodes, and the gate electrodes of the second transfer transistors in adjacent memory cells are formed into a second island-like configuration, which is shared by the gate electrode. Thus, the adjacent memory cells share components such as the contacts for connecting the word lines and the gate electrodes, resulting in reduction of the cell size.

BRIEF DESCRIPTION OF THE DRAWINGS

FIG. 20 is a view of an equivalent circuit in the fourth embodiment.

DETAILED DESCRIPTION OF THE PREFERRED EMBODIMENTS

First Embodiment

Figure 1A:
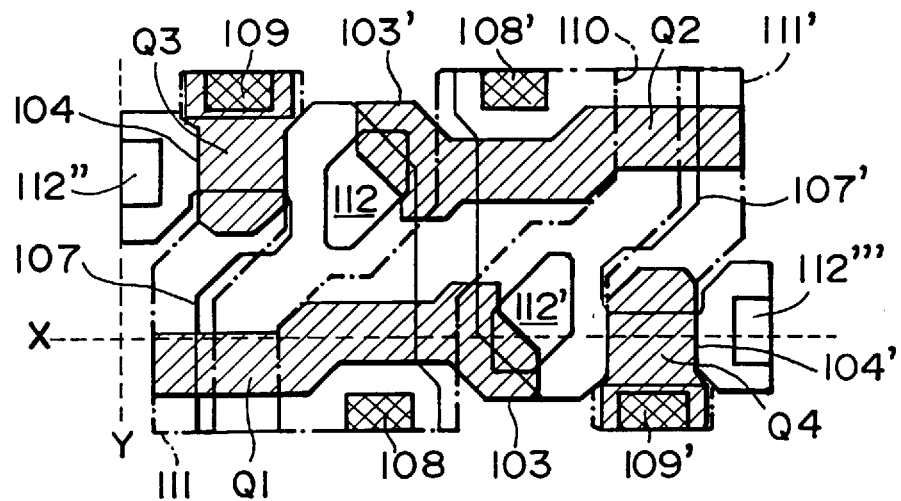
FIGS. 1A to 1C are plan views of a memory cell constructed in accordance with a first embodiment of the present invention.
Figure 1B:
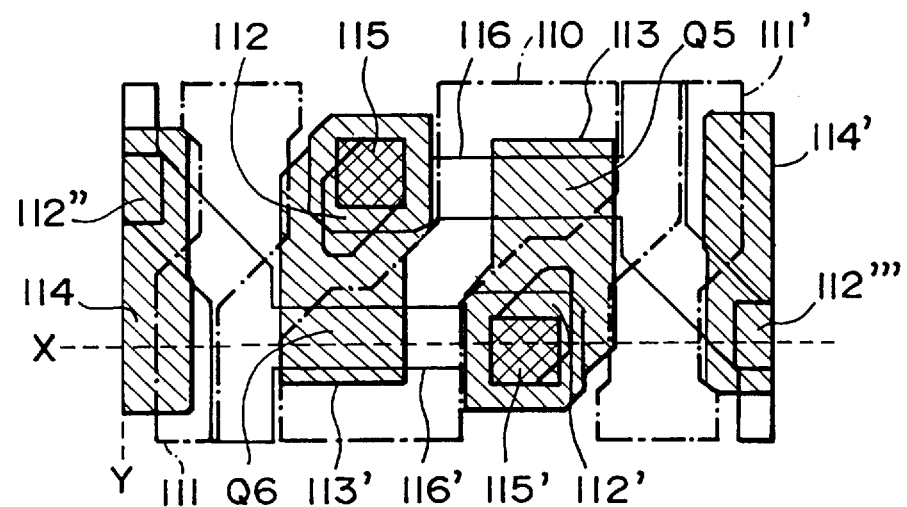
Figure 1C:
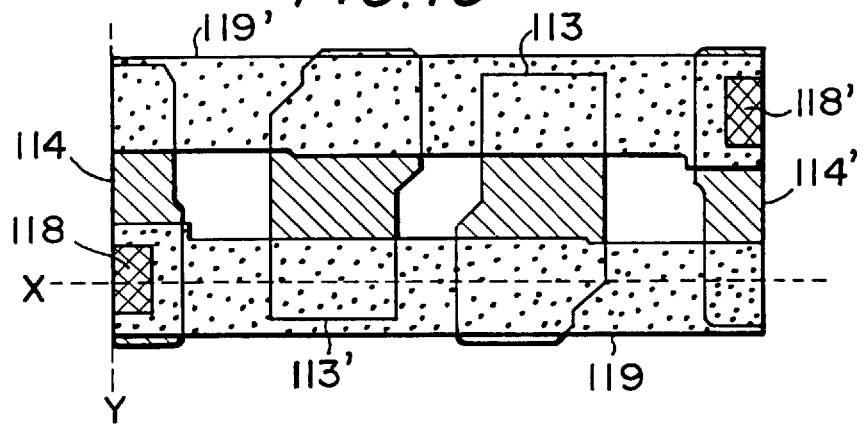
Figure 2:
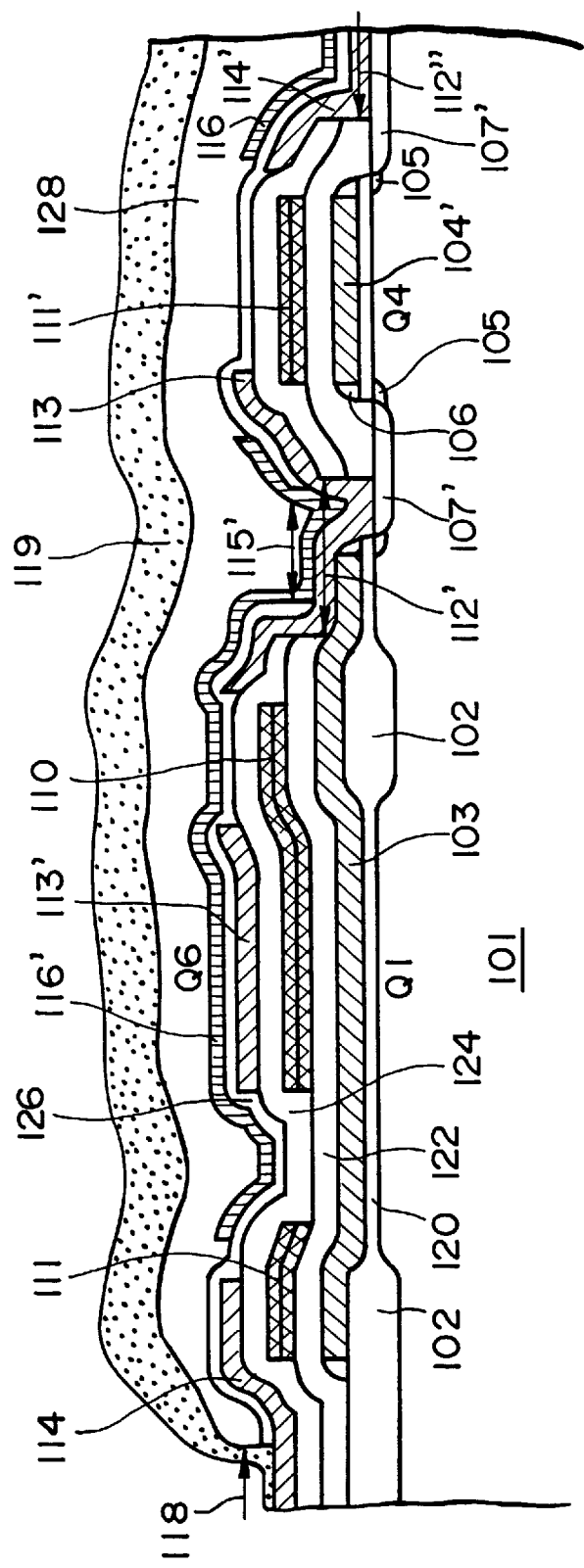
FIG. 2 is a sectional view of the memory cell shown in FIGS. 1A to 1C.
Figure 3:
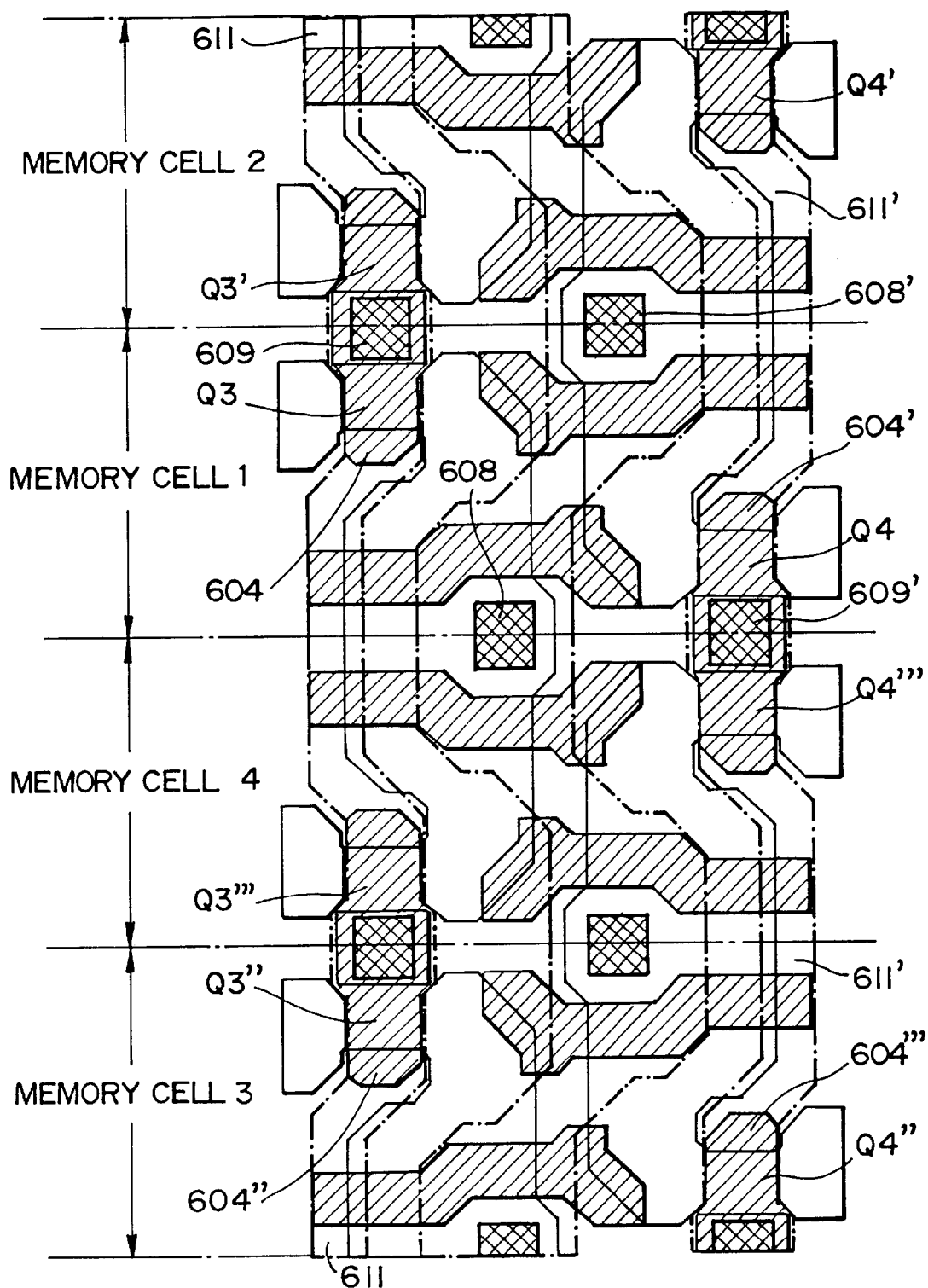
FIG. 3 is a view of an array of memory cells.

Referring to FIGS. 1A to 1C, FIG. 1A is a plan view showing active areas 107, 107', a first wiring layer (including gate electrodes 103, 103', 104 and 104' of driver and transfer transistors Q1, Q2, Q3 and Q4), a second wiring layer (including a ground line 110 and first and second word lines 111, 111') and so on. FIG. 1B is a plan view showing the second wiring layer, a third wiring layer (including gate electrodes 113 and 113' of thin-film transistors (TFTs) Q5 and Q6 and leader lines 114 and 114' of bit lines) and so on. FIG. 1C is a plan view showing the third wiring layer, a fifth wiring layer (including bit lines 119 and 119') and so on. FIG. 2 is a cross-sectional view taken along a line X in FIG. 1A to 1C. FIG. 3 shows an array of the memory cells as shown in FIGS. 1A to 1C.

Figure 24:
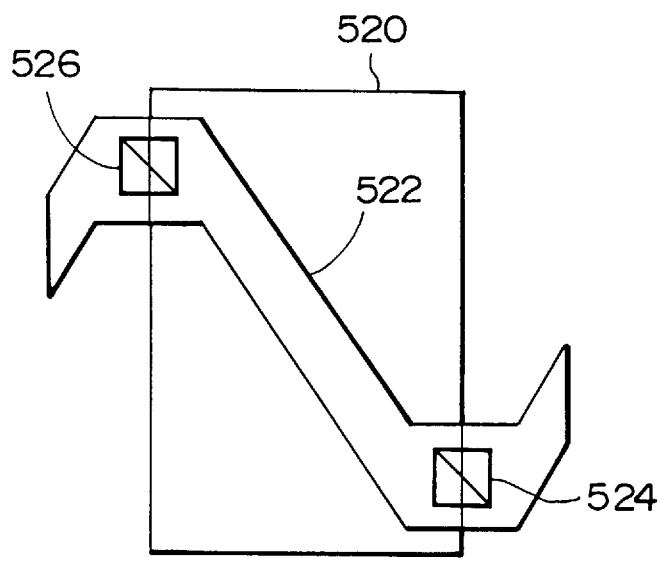
FIG. 24 is a view of still another memory cell constructed in accordance with the prior art.

As can be seen from these figures, the first word line 111 connects the gate electrodes of the first transfer transistors (transfer gates) Q3 in the adjacent memory cells through a wiring layer different from the layer which forms these gate electrodes. The second word line 111' connects the gate electrodes of the second transfer transistors Q4 in the adjacent memory cells through a wiring layer different from the layer which forms these gate electrodes. The ground line 110 connects the source regions of the first and second driver transistors Q1, Q2. The first and second word lines 111, 111' and ground line 110 are formed by the same wiring layer, unlike the memory cell as shown in FIG. 24. As shown in FIG. 2, the first and second word lines 111, 111' and ground line 110 are formed by the second wiring layer that is located above the first wiring layer (including the gate electrodes 103, 103', 104 and 104'). According to the first embodiment, it is unnecessary to provide a new layer to form the ground line, since the word lines and ground line are in the same wiring layer. This can optimize the number of wiring layers and manufacturing steps.

(1) Structure of Memory Cell

Figure 5:
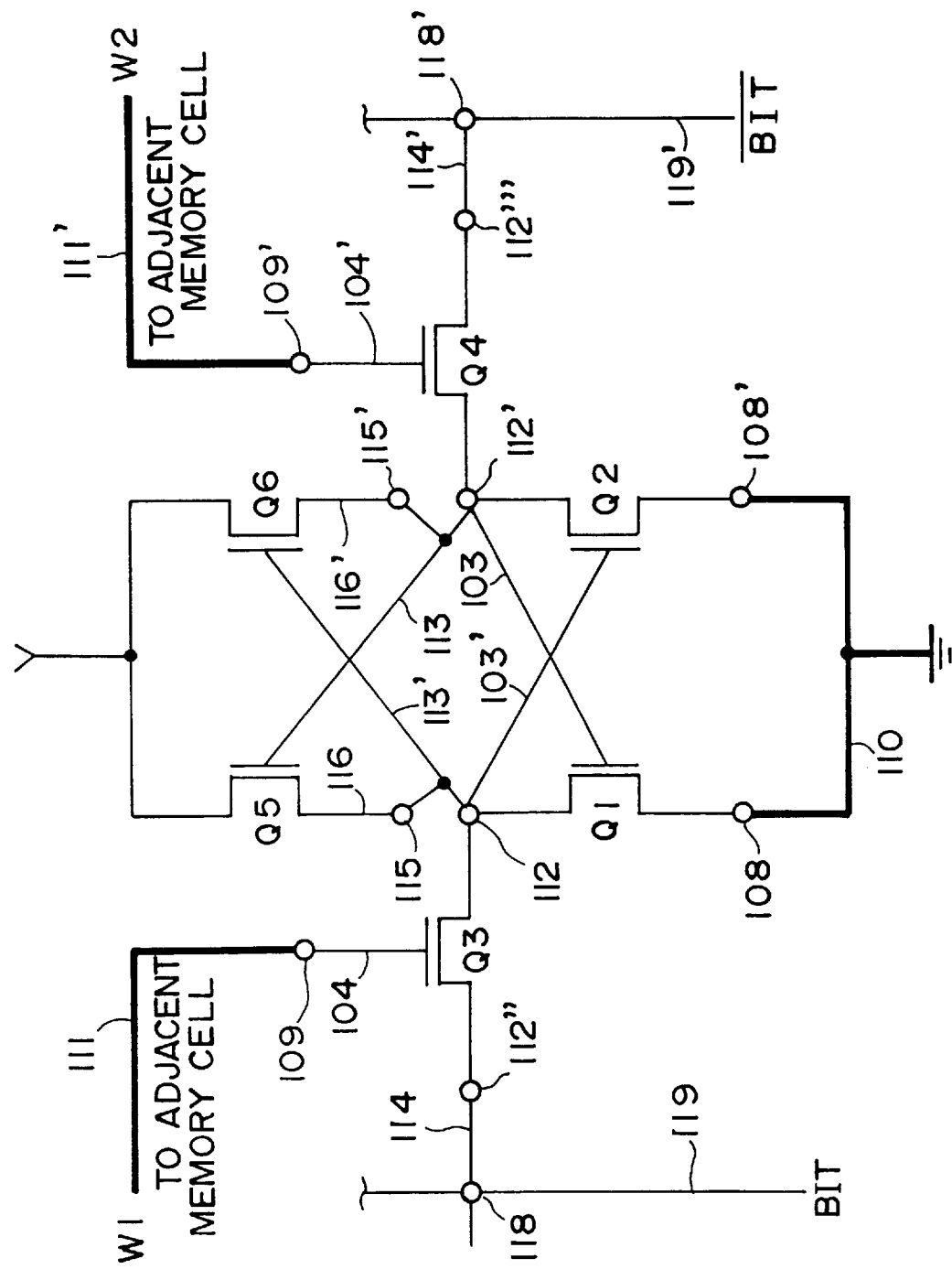
FIG. 5 is a view of an equivalent circuit in the first embodiment.

The structure of the memory cell according to the first embodiment will now be described with reference to FIG. 5 which shows the equivalent circuit and the like. As shown in FIG. 5, the memory cell comprises a flip-flop circuit including the driver transistors Q1, Q2 and TFTs Q5, Q6, and the transfer transistors Q3, Q4. As indicated by the thick line in FIG. 5, the first embodiment includes the gate electrode 104 of the adjacent memory cell Q3 that is connected to the first word line 111, the gate electrode 104' of the adjacent memory cell Q4 is connected to the second word line 111', and the first and second word lines 111, 111' are formed by the same wiring layer as that of the ground line 110.

In the first embodiment, the first wiring layer includes the gate electrodes 103, 103' of the driver transistors Q1, Q2 as well as the gate electrodes 104, 104' of the transfer transistors Q3, Q4.

The ground line 110 in the second wiring layer is connected to the source regions of the transistors Q1 and Q2 through source contacts (through holes) 108 and 108'. The first and second word lines 111, 111' in the second wiring layer are also connected to the gate electrodes 104 and 104' of the transistors Q3 and Q4 in the first wiring layer through gate contacts (through holes) 109 and 109'.

The gate electrode 113 of the TFT Q5 in the third wiring layer is connected to the drain regions of the transistors Q2 and Q4 and the gate electrode of the transistors Q1 through a drain contact (through hole) 112'. The gate electrode 113' of the TFT Q6 in the third wiring layer is connected to the drain regions of the transistors Q1 and Q3 and the gate electrode of the transistor Q2 through the drain contact 112. The leader electrodes 114 and 114' of the bit lines in the third wiring layer are connected to the source contacts of the transistors Q3 and Q4 through source contacts 112" and 112'".

Silicon film 116 and 116' of the TFTs Q5 and Q6 included in the fourth wiring layer are connected to the gate electrodes 113' and 113 of the TFTs Q6 and Q5 through contacts 115 and 115'.

Bit lines 119 and 119' in the fifth wiring layer are connected to the leader electrodes 114 and 114' of the bit lines in the third wiring layer through contacts 118 and 118'.

(2) Manufacturing Process

The process of manufacturing the memory cell of the first embodiment will now be described with reference to FIGS. 1A to 1C and FIG. 2.

(a) Boron ($B^+$) as a p-type impurity is first implanted into an n-type silicon substrate, and then driven in at 1100° C. to form a PWELL area 101. Active areas are then patterned to form an element separation film 102 having a thickness of 400 nm using the LOCOS process.

A gate oxide film 120 of 10 nm is then formed at 900° C. under an atmosphere of $O_2$. A polysilicon film of 200 nm is formed through the CVD process. Thereafter, a thermal diffusion with $POCl_3$ is carried out for 20 minutes at 850° C. to introduce phosphorus ($P^+$) as a n-type impurity into the polysilicon film. A photographic process is then performed to pattern the gate electrodes. A dry etching process is then performed by Reactive Ion Etching (RIE) using $Cl_2$ gas to form the gate electrodes in the first wiring layer. At this point, the gate electrodes 103 and 103' of the driver transistors Q1 and Q2 and the gate electrodes 104 and 104' of the transfer transistors Q3 and Q4 are formed simultaneously.

(b) The gate electrodes are then masked to implant phosphorus as a n-type impurity at a dose of $2 \times 10^{13}$ $cm^{-2}$ and an acceleration energy of 50 KeV to form an offset area 105. A $SiO_2$ film of 250 nm is then formed using a CVD process. Thereafter, plasma etching is carried out to perform an etch-back for forming a sidewall film 106. The sidewall film and gate electrodes are then masked to implant arsenic ($As^+$) as a n-type impurity at a dose of $4 \times 10^{15}$ $cm^{-2}$ and an acceleration energy of 50 KeV, so as to form active areas 107 and 107' of $N^+$. A $SiO_2$ film of 150 nm is formed using a CVD process, and subsequently a photographic process is carried out to pattern the contacts. Dry etching is carried out through RIE using $CF_4$ gas, so as to form source contacts 108 and 108' on $N^+$ areas which are the source regions of the driver transistors Q1 and Q2, and also to provide gate contacts 109 and 109' on the gate electrodes of the transfer transistors Q3 and Q4.

A polysilicon film of 100 nm is formed using a CVD process. Phosphorus as a n-type impurity is then implanted at a dose of $6 \times 10^{15}$ $cm^{-2}$ and an acceleration energy of 35 KeV to introduce pt into the polysilicon film. Subsequently, sputtering is performed to form a $WSi_2$ film of 100 nm. Thereafter, a photographic process is carried out to pattern the ground and word lines. Dry etching is performed through RIE using $Cl_2$ gas to form the second wiring layer including the ground line 110 and the word lines 111 and 111'. At this point, the ground and line 110 and word lines 111, 111' are formed at the same time.

(c) A $SiO_2$ film of 150 nm is formed using a CVD process, and subsequently a photographic process is carried out to pattern the contacts. Dry etching is then performed through RIE using $CF_4$ gas, so as to form the drain contact 112 over the drain region of the driver transistor Q1 and the gate electrode of the driver transistor Q2, and likewise to provide the drain contact 112' over the drain region of the driver transistor Q2 and the gate electrode of the driver transistor Q1. Furthermore, the source contacts 112" and 112''' are formed on the source regions of the transfer transistors Q3 and Q4.

A polysilicon film of 150 nm is then formed through using a CVD process. Subsequently, phosphorus as a n-type impurity is implanted at a dose of $6 \times 10^{15}$ $cm^{-2}$ and an acceleration energy of 35 KeV to introduce pt into the polysilicon film. The photographic process is then carried out to pattern the gate electrodes of the TFT. Dry etching is then performed through RIE using $Cl_2$ to form the third wiring layer, that is, the gate electrodes 113 and 113' of TFTs Q5 and Q6 and the leader electrodes 114 and 114' of the bit lines.

(d) As the gate films in the TFTs Q5 and Q6, a $SiO_2$ film is formed using a CVD process. A photographic process is then carried out to pattern the contacts. Wet etching is performed with a hydrogen fluoride (HF) solution to form contacts 115 and 115' on the gate electrodes of the TFTs Q5 and Q6. An amorphous silicon film of 30 nm is then formed at a pressure of 60 Pa and a temperature of 550° C. using a CVD process using $SiH_4$ gas. Thereafter, a photographic process is used to pattern the channel areas in the TFTs. $BF_2^+$ as a p-type impurity is then implanted at a dose of $1 \times 10^{15}$ $cm^{-2}$ and an acceleration energy of 35 KeV to introduce boron into the source and drain regions of the TFTs Q5 and 06. The photographic process is then performed to pattern the TFT areas. Dry etching is performed through RIE using $Cl_2$ gas to form the fourth wiring layer, that is, the silicon film 116 and 116' of the TFTs Q5 and Q6. The structure of the TFTs may be any one of various known structures, and thus the gate electrodes may be located above the silicon film.

(e) A $SiO_2$ film of 100 nm is formed using a CVD process, and thereafter, a boro-phosphosilicate glass (BPSG) 128 of 400 nm is formed using a normal pressure CVD process. A photographic process is then carried out to pattern the contact holes. Subsequently, dry etching is made through RIE using $CF_4$ gas to form contact holes 118 and 118' on the leader electrodes 114 and 114' of the bit lines in the third wiring layer. Annealing is performed for 20 minutes at 900° C. in an atmosphere of $N_2$ to execute the flattening and contact hole reflow. This annealing also forms the ground line 110 and word lines 111 and 111' into silicide to provide WSi polycide. Thus, the sheet resistance is reduced to 10 $\Omega/\square$.

Sputtering is then carried out to form films of Ti, TiN and AlCu having a thickness of 15 nm, 100 nm and 700 nm, respectively. A photographic process is then performed to pattern the films. Subsequently, dry etching is carried out through RIE using Cl gas to form aluminum wirings 119 and 119' in the fifth wiring layer. Thus, the memory cell is completed in the above manner.

Figure 6:
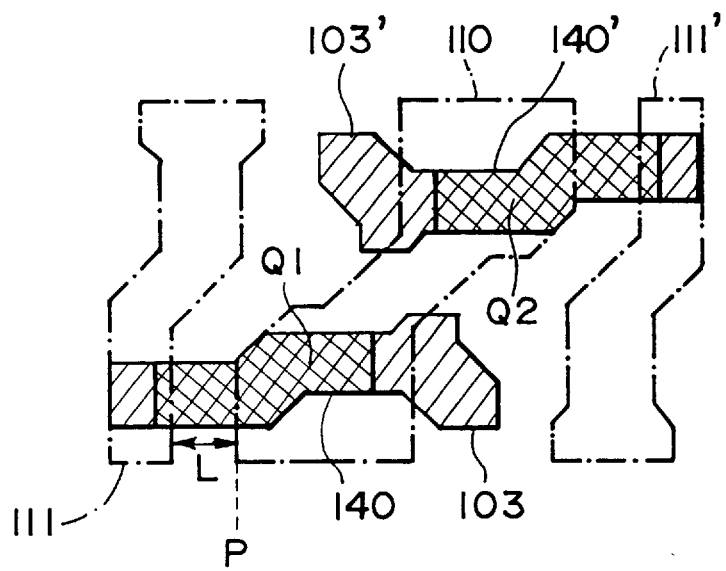
FIG. 6 is a view illustrating the relationship between a ground line and channel areas of driver transistors.

(3) Configurations of Wiring, Contact and Others (a) The memory cell of the first embodiment includes the ground line 110 disposed in such a manner as shown in FIG. 6. More particularly, the ground line 110 is disposed to cover all or part of the channel areas 140 and 140' of the driver transistors Q1 and Q2, while maintaining at least the minimum spacing between the ground line 110 and the first word line 111 and second word line 111'. The minimum spacing used herein means the least distance possible in design. In FIG. 6, the minimum spacing corresponds to a distance L between the ground line 110 and the first and second word lines 111, 111' all of which are included in the second wiring layer. Furthermore, the channel areas 140 and 140' of the transistors Q1 and Q2 are where the gate electrodes 103 of the transistors Q1 and Q2 and the active areas 107 and 107' (see FIG. 1A) overlap. By covering the channel areas 140 and 140' of the transistors Q1 and Q2 with the ground line 110, they can be shielded from an electric field. This can stabilize the operation of the memory cell and reduce the voltage required for operation.

From the viewpoint of the stabilization of the memory cell operation, it is desirable that all the channel areas 140 and 140' are covered with the ground line 110. In order to maintain the resistance in the first and second word lines 111, 111' at a level equal to or lower than the acceptable level, however, it is required to maintain the wiring width of the word lines to some extent. With the channel area 140, for example, the ground line 110 cannot be extended leftward from a line P in FIG. 6. In such a case, if the channel width of the transistor Q1 is shortened to a size smaller than the width illustrated in FIG. 6, the entire channel area 140 can be covered with the ground line 110. If the channel width of the transistor Q1 is shorter, however, the β ratio of the memory cell (the β ratio of the driver transistors to the transfer transistors) becomes shorter and thus the capabilities of the memory cell such as the operational rate, operational stability, lower operational voltage are reduced. Taking the above matters into consideration, the memory cell of the first embodiment covers only part of the channel areas 140 and 140' with the ground line 110. However, the entire channel areas may be covered with the ground line by skillfully adjusting the word line width, the β ratio and the like.

Figure 7:
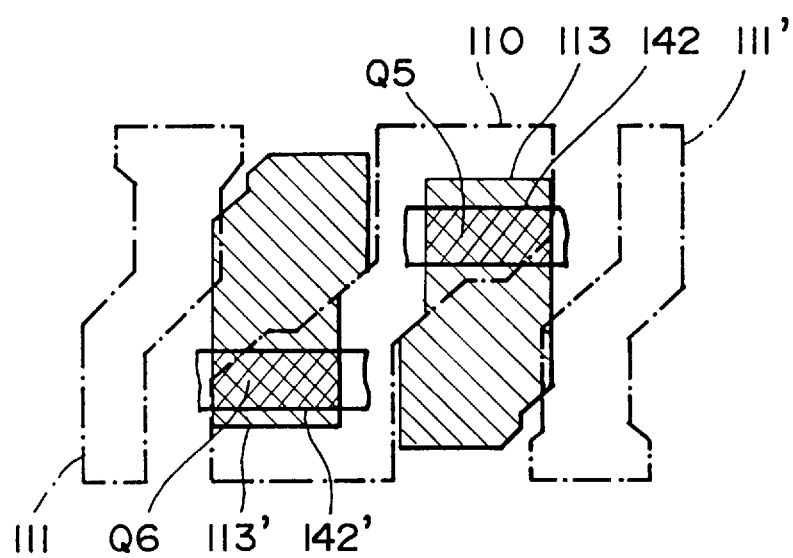
FIG. 7 is a view illustrating the relationship between the ground line and channel areas of thin-film transistors (TFTs) (load transistors).

(b) In the memory cell, the ground line 110 is disposed in the area between the channel areas 142 and 142' of the TFTs Q5 and Q6 (first and second load transistors) and the channel areas 140 and 140' of the driver transistors Q2 and Q1, as shown in FIG. 7. This disposition of the ground line 110 can effectively prevent the driver transistors Q2 and Q1 from the adverse effects of the electric field and the like generated in the load transistors Q5 and Q6. Conversely, the load transistors Q5 and Q6 are prevented from the negative effects of the electric field and the like which are generated in the driver transistors Q1 and Q2. Therefore, it is possible to ensure stability of the memory cell and reduction of the voltage required for operation. Particularly, since the transistors Q5 and Q6 are located immediately above the transistors Q2 and Q1 in the memory cell, the disposition of the ground line 110 between the transistor pair of Q2 and Q1 and the other transistor pair of Q5 and Q6 provides an effective technique of eliminating adverse effects of the electric field and the like. Furthermore, as is apparent from FIG. 7, the structure of the memory cell is such that the ground line 110 is disposed over substantially the entire overlapping portions of the channel areas of the transistors Q2 and Q1 and the channel areas of the transistors Q5 and Q6. Therefore, such a structure ensures the removal of the adverse effects of the electric field and the like.

As will be described in connection with the second embodiment, the ground line is preferably disposed between the channel areas of the transistors Q2 and Q1 and load resistors R5, R6, when these load resistors are used in place of the TFTs Q5 and Q6 which are load transistors.

Figure 8:
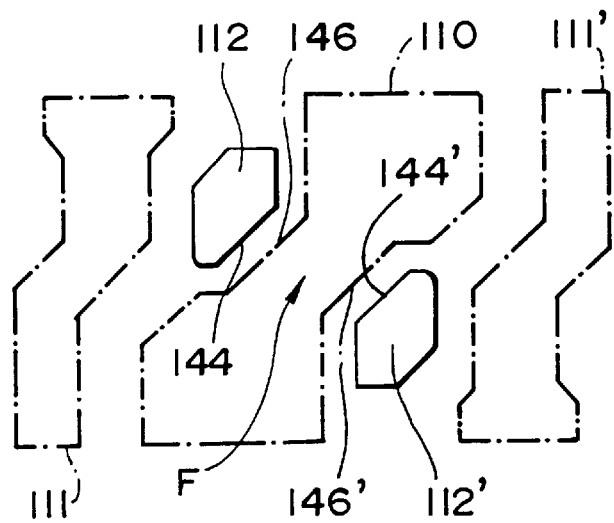
FIG. 8 is a view illustrating the relationship between he ground line and drain contacts.

(c) In the memory cell, the first drain contact 112 for connecting the drain regions of the transistors Q1, Q3 and the gate electrode of the transistor Q2 as well as the second drain contact 112' for connecting the drain regions of the transistors Q2, Q4 and the gate electrode of the transistor Q1 are arranged in the following manner. As shown in FIG. 8, the corner of the first drain contact 112 facing the second drain contact 112' is chamfered to form a first chamfered side 144. The corner of the second drain contact 112' facing the first drain contact 112 is chamfered to form a second chamfered side 144'. Thus, the drain contacts 112 and 112' can be located closer to each other to optimize the size of the memory cell.

The cell size is determined by the size of and distance between the contacts in the memory cell. As is apparent from FIG. 1A, therefore, the cell size can be reduced by decreasing the size of the drain contacts 112 and 112' or the distance between the drain contacts 112 and 112'. When the size of the drain contacts 112 and 112' is reduced, however, the resistance in the contacts will be increased. This leads to instability of the operation of the memory cell.

The drain contacts 112 and 112' include the chamfered sides 114 and 114' as shown in FIG. 8, so that they can be located closer to each other while maintaining their size at a desired level. In other words, the cell size can be reduced, while maintaining the operational stability and the like in the memory cell to some degree.

(d) In the memory cell, the ground line 110 is located in the area between the first and second chamfered sides 144 and 144', as shown in FIG. 8. Therefore, the aspect ratio of the ground line 110 can be set as low as 3.0 or less for example, while optimizing the size of the memory cell. When the aspect ratio of the ground line 110 is lowered, the wiring resistance in the ground line can be lowered to provide stability of the operation of the memory cell and the reduction of the voltage required for the operation.

More particularly, the cell size can be reduced when the distance between the drain contacts 112 and 112' is decreased as shown in FIG. 8. On the other hand, when the width of the ground line 110 in such an area as shown by F in FIG. 8 is reduced, the wiring resistance in the ground line increases.

In the memory cell, the drain contacts 112 and 112' include the chamfered sides 114 and 114', respectively, and this structure secures the width of the ground line 110 in the area F to some degree. In other words, the wiring resistance in the ground line 110 can be reduced while decreasing the cell size, resulting in stabilization of the memory cell operation and reduction of the voltage required in operation. In the memory cell, particularly, the ground line 110 includes side 146 which is opposite and parallel to the first chamfered side 114 and side 146' which is opposite and parallel to the second chamfered side 114'. Thus, the width of the ground line 110 at the area F can be optimized to provide lower wiring resistance in the ground line.

Figure 9:
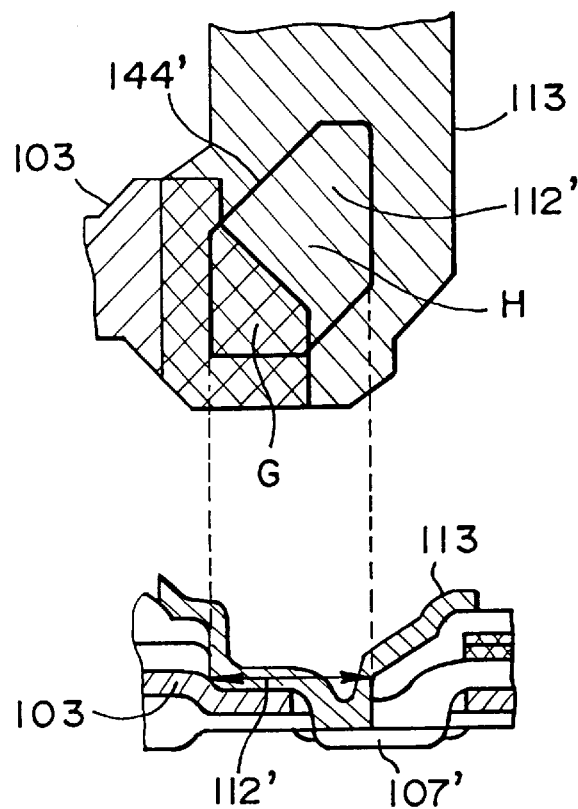
FIG. 9 is a view illustrating a technique of providing connections with gate electrodes of the TFTs.

(e) In the memory cell, the drain regions (active areas 107') of the second driver and transfer transistors Q2, Q4 are connected to the gate electrode 103 of the first driver transistor Q1 through the gate electrode 113 of the TFT Q5, as shown in FIG. 9. Similarly, the drain regions (active areas 107) of the first driver and transfer transistors Q1, Q3 are connected to the gate electrode 103' of the second driver transistor Q2 through the gate electrode 113' of the TFT Q6. More particularly, the gate electrode 103 of the driver transistor Q1 is connected to the gate electrode 113 of the TFT Q5 in the area as shown by G in FIG. 9, this gate electrode 113 being connected to the drain regions (active areas 107') of the transistors Q2 and Q4 in the area as shown by H in FIG. 9.

In order to stabilize the operation of the memory cell and to reduce the voltage required in operation, the resistance in the contacts should be lowered. In order to lower the contact resistance in the drain contact 112', the area H should be increased. When the area H is increased, the size of the drain contact 112' is increased and this enlarges the size of the memory cell. Since the drain contact 112' has the chamfered side 144', the memory cell can increase the area H and decrease the contact resistance, while optimizing the cell size. This can stabilize the operation of the memory cell, lower the voltage required in operation, improve the reliability and so on.

Figure 10:
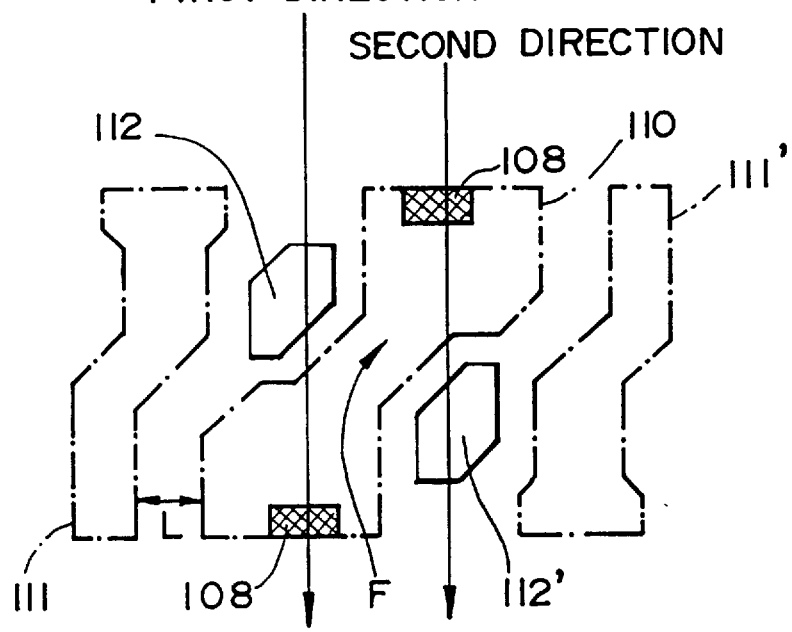
FIG. 10 is a view illustrating the relationship between the ground line and the drain and source contacts.

(f) In the memory cell, as shown in FIG. 10, the first source contact 108 for connecting the source region of the first driver transistor Q1 to the ground line 110 is separated from the first drain contact 112 by a given distance in a first direction. On the other hand, the second source contact 108' for connecting the source region of the second driver transistor Q2 to the ground line 110 is separated from the second drain contact 112' by a given distance in a second direction parallel to the first direction. The ground line 110 is disposed in such a manner that they contain the first and second source contacts 108, 108', while maintaining at least the minimum spacing L between the ground line 110 and the first and second drain contacts 112, 112'.

Therefore, even when the contacts are arranged as shown in FIG. 10, the aspect ratio of the ground line 110 can be lowered. The contact arrangement is an important factor for determining the size of the memory cell. By arranging the contacts along the first and second directions as shown in FIG. 10, the memory cell can provide contacts which are disposed compactly. In such an arrangement, the ground line 110 contains the source contacts 108 and 108' without contacting the drain contacts 112 and 112'. Therefore, the ground line 110 can be angled across the memory cell between the drain contacts as shown in FIG. 10. As a result, the ground line 110 can be disposed while optimizing the width of the ground line 110 in the area F of FIG. 10. This can reduce the resistance in the ground line 110 and the cell size.

When the ground line 110 is angled as mentioned above and the memory cells are disposed in linear symmetry, the angled ground line 110 can be connected sequentially between the memory cells.

Figure 11:
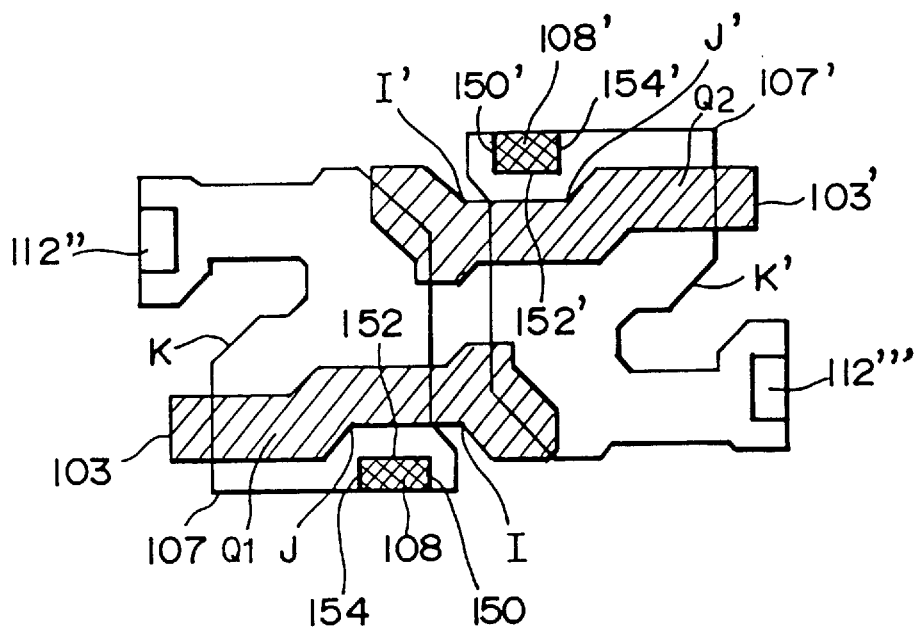
FIG. 11 is a view illustrating the relationship between source contacts and gate electrodes of the driver transistors.

(g) In the memory cell, the gate electrode 103 of the first driver transistor Q1 is angled around the first source contact 108 as shown by I and J in FIG. 11, while maintaining at least the minimum spacing between the gate electrode 103 and the respective sides 150, 152 and 154 of the first source contact 108. Similarly, the gate electrode 103' of the second driver transistor Q2 is angled around the second source contact 108' as shown by I' and J' in FIG. 11, while maintaining at least the minimum spacing between the gate electrode 103' and the respective sides 150', 152' and 154' of the second source contact 108'.

Thus, the effective width of the gate electrodes 103 and 103' can be made longer to increase the β ratio in the memory cell, resulting in stabilization of the memory cell operation and reduction of voltage required for operation of the device.

As shown by K and K' in FIG. 11, the corners of the active areas 107 and 107' can be chamfered to reduce the cell size.

Figure 4:
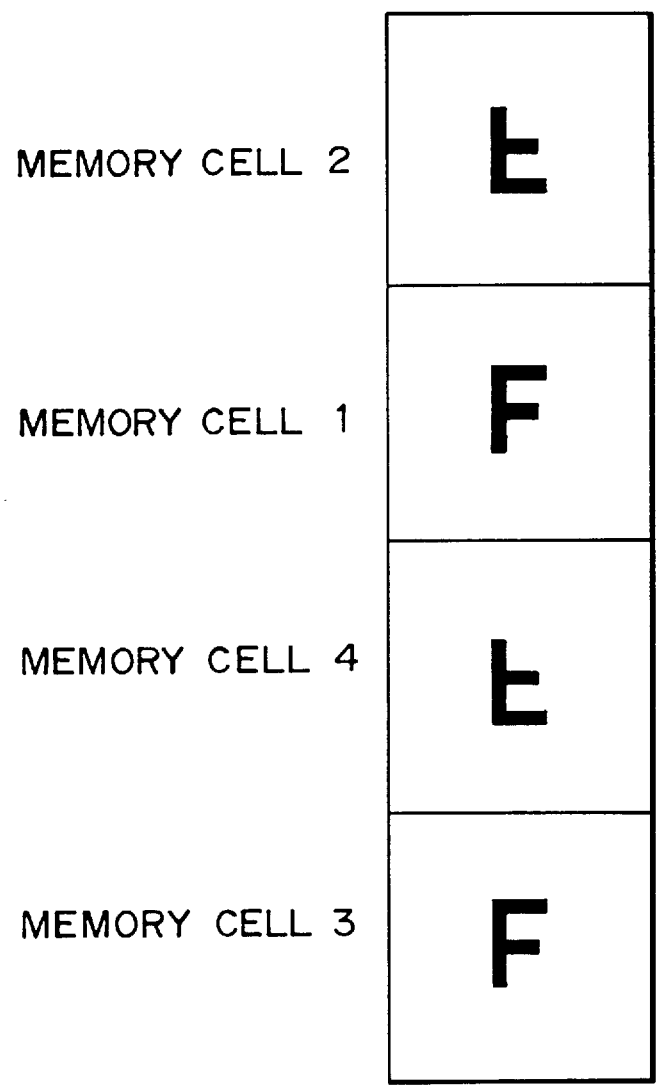
FIG. 4 is a view illustrating the orientation of the array of the memory cells.

Finally, the arrangement of the memory cells will be described with reference to FIGS. 3 and 4. Referring to FIG. 4, F indicates the orientation of the memory cell shown in FIG. 1A. The memory cells are disposed in linear symmetry about the boundary between any adjacent memory cells. For example, the memory cell 1 is disposed in linear symmetry relative to the respective memory cells 2 and 4.

The gate electrodes of the first transfer transistors Q3 and Q3' in the juxtaposed memory cells 1 and 2 are formed into an island-like configuration by a first wiring layer 604. Similarly, the gate electrodes of the first transfer transistors Q3" and Q3'" in the juxtaposed memory cells 3 and 4 are formed into an identical island-like configuration by a first wiring layer 604". The first wiring layers 604 and 604' are connected to each other through a first word line 611 in the second wiring layer.

The gate electrodes of the second transfer transistors Q4 and Q4' in the juxtaposed memory cells 1 and 4 are formed into an island-like configuration by a first wiring layer 604'. The first wiring layer 604' is connected to the first island-like wiring layer 604" of a memory cell 3 through a word line 611' in the second wiring layer. In such a manner, the adjacent memory cells can share the source contacts 608, 608' and gate contacts 609, 609', reducing the size of the device.

Second Embodiment

Figure 12A:
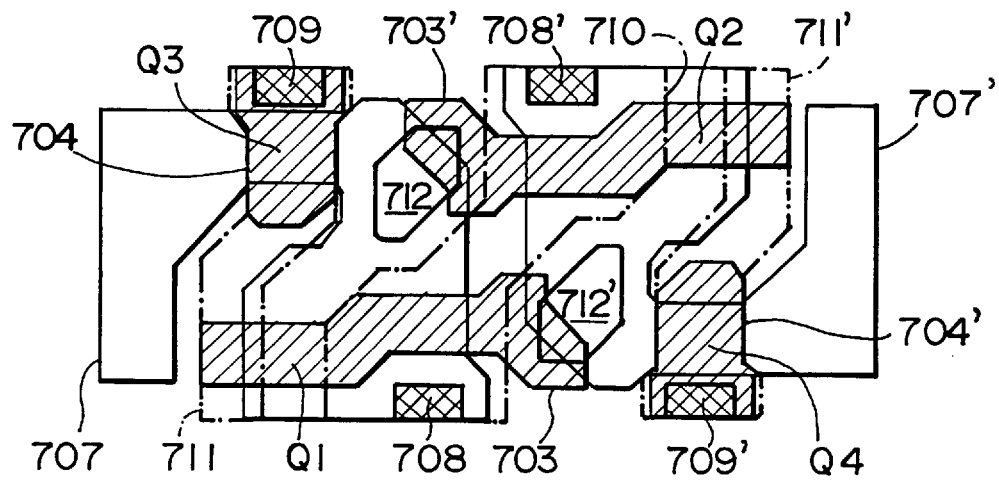
FIGS. 12A to 12C are plan views of a memory cell constructed in accordance with a second embodiment of the present invention.
Figure 12B:
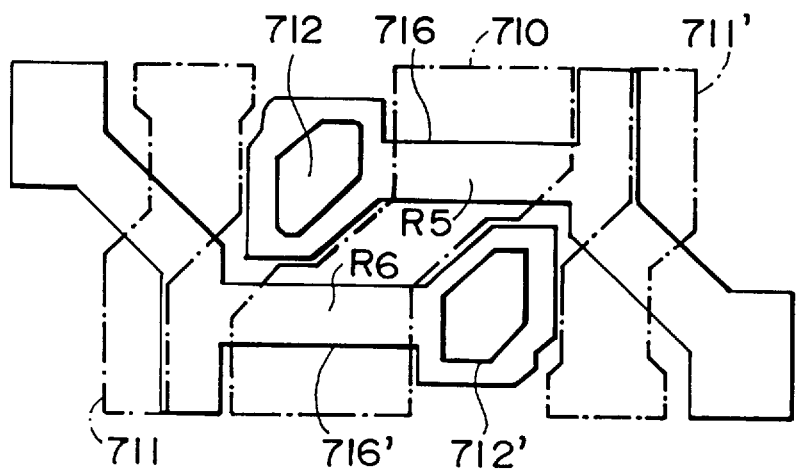
Figure 12C:
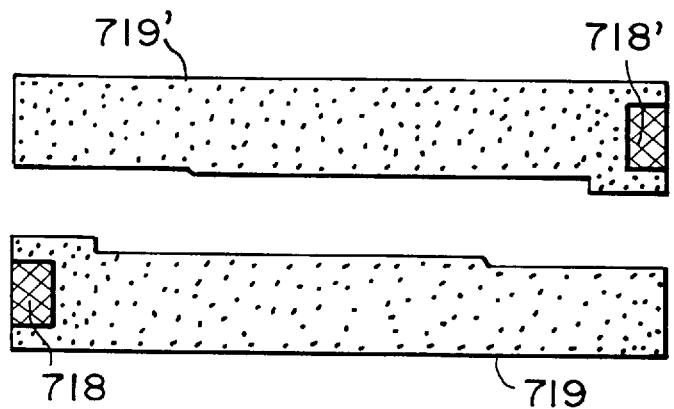
Figure 13:
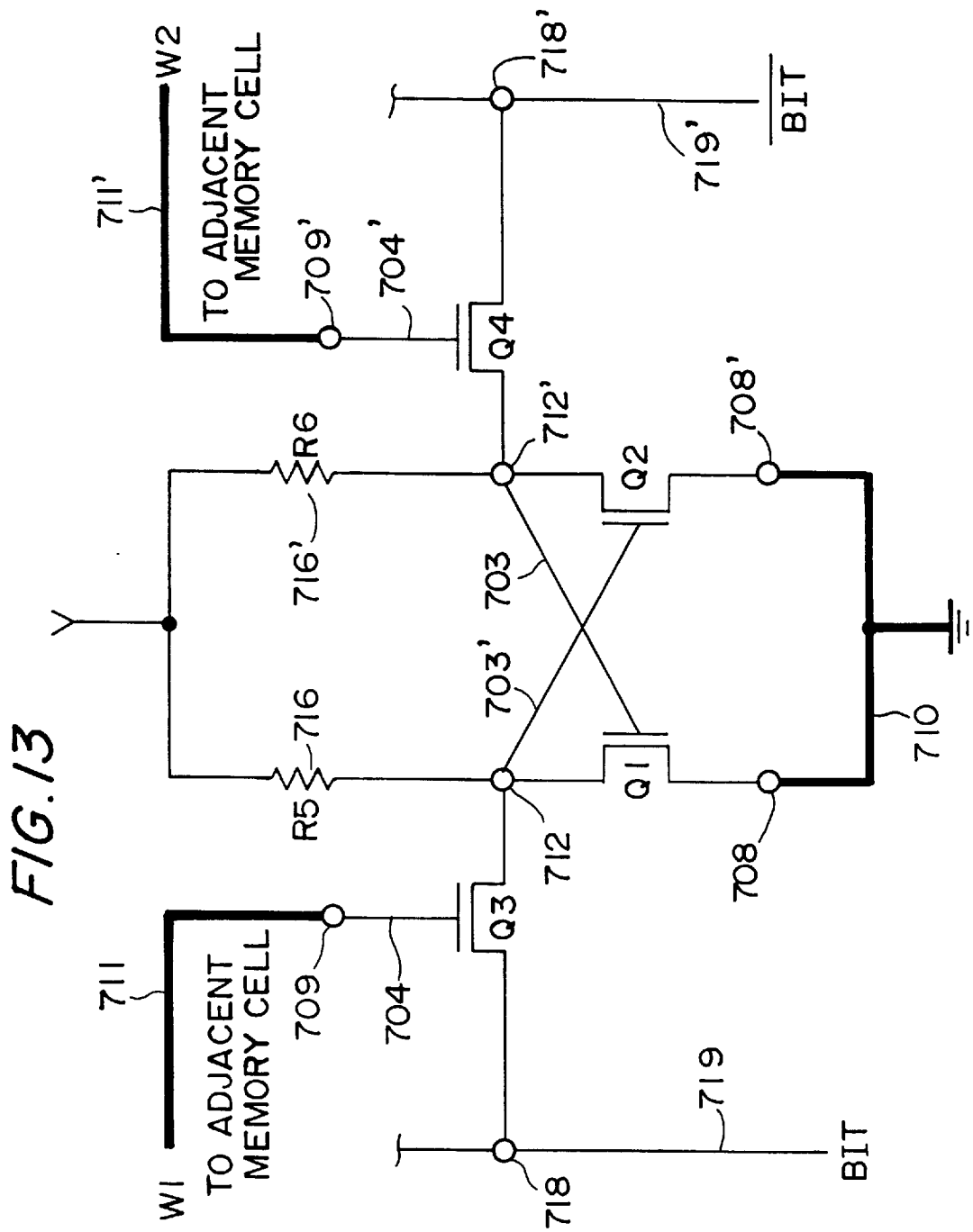
FIG. 13 is a view of an equivalent circuit in the second embodiment.

FIGS. 12A to 12C show plan views of a memory cell constructed in accordance with a second embodiment of the present invention, while FIG. 13 shows an equivalent circuit which is used therein. As is apparent from the differences of FIG. 5 with FIG. 13, the second embodiment is different from the first embodiment in that the load transistors Q5 and Q6 are replaced with load resistors R5 and R6.

The structure of the memory cell according to the second embodiment will be described with reference to FIGS. 12A to 12C and 13. In the second embodiment, a first wiring layer includes gate electrodes 703, 703' of driver transistors Q1, Q2 and gate electrodes 704, 704' of transfer transistors Q3, Q4.

A second wiring layer includes a ground line 710 which is connected to the source regions of the transistors Q1 and Q2 through source contacts 708 and 708'. The second wiring layer also includes first and second word lines 711, 711' which are connected to the gate electrodes 704 and 704' of the transistors Q3 and Q4 through gate contacts 709 and 709'.

A third wiring layer includes a load transistor 716 connected to the drain regions of the transistors Q1 and Q3 and the gate electrode of the transistor Q2 through a drain contact 712, and a load transistor 716' connected to the drain regions of the transistors Q2 and Q4 and the gate electrode of the transistor Q1 through a drain contact 712'.

A fourth wiring layer includes bit lines 719 and 719' which are respectively connected to the source regions of the transistors Q3 and Q4 through contacts 718 and 718'.

The process of producing the memory cell will be described hereafter. In the second embodiment, the manufacturing steps of the gate electrodes 113 and 113' of the TFTs, of a SiO$_2$ film 126 that provides the gate films of the TFTs and of the contacts 112" and 112'" are omitted, unlike the first embodiment shown in FIGS. 1A to 1C and 2. In place of the ion implantation of p-type impurity BF$_2^+$ into the source and drain regions of the TFTs, n-type impurity arsenic is ion-injected into these regions at a dose of $4\times10^{15}$ cm$^{-2}$ and an acceleration energy of 50 KeV to form power supply lines. The other regions which have not been subjected to ion implantation are used for high-resistant loads.

The second embodiment can also reduce the planar area of the memory cell, stabilize the operation of the memory cell and lower the voltage required for operation, by providing the wire arrangements and contact configurations as shown in FIGS. 6 to 11.

Third Embodiment

Figure 14A:
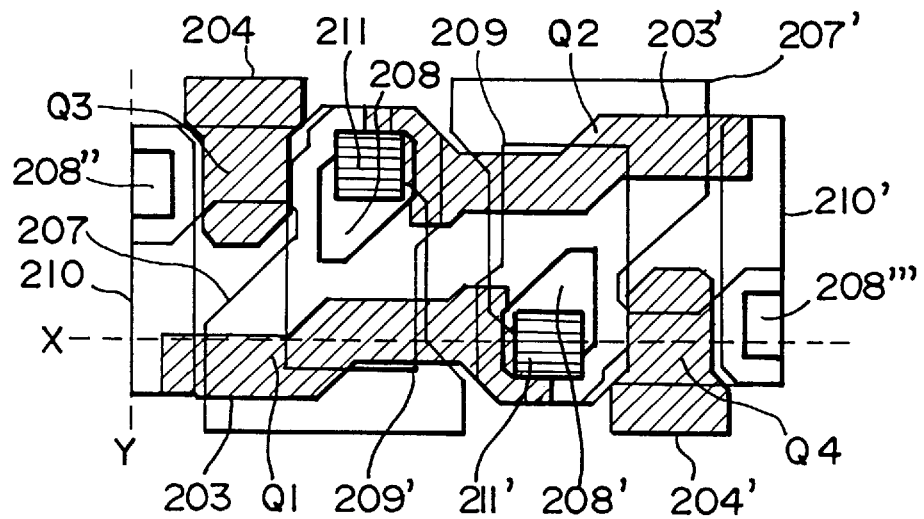
FIGS. 14A to 14C are plan views of a memory cell constructed in accordance with a third embodiment of the present invention.
Figure 14B:
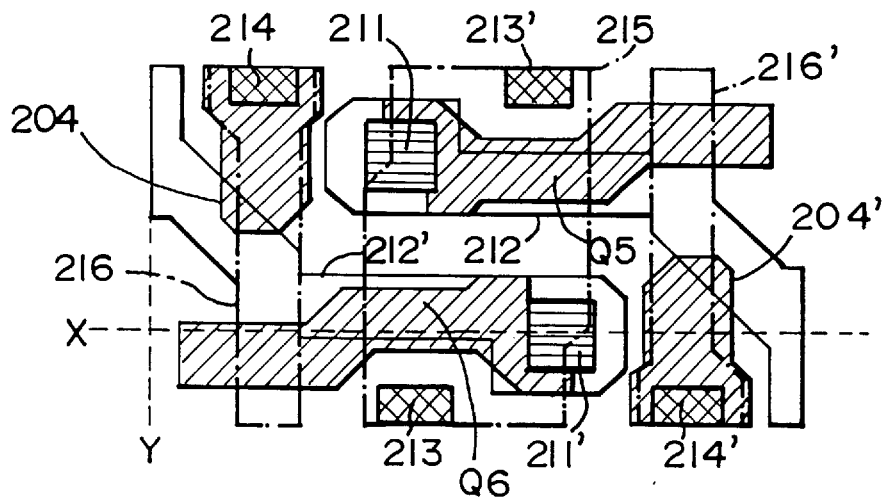
Figure 14C:
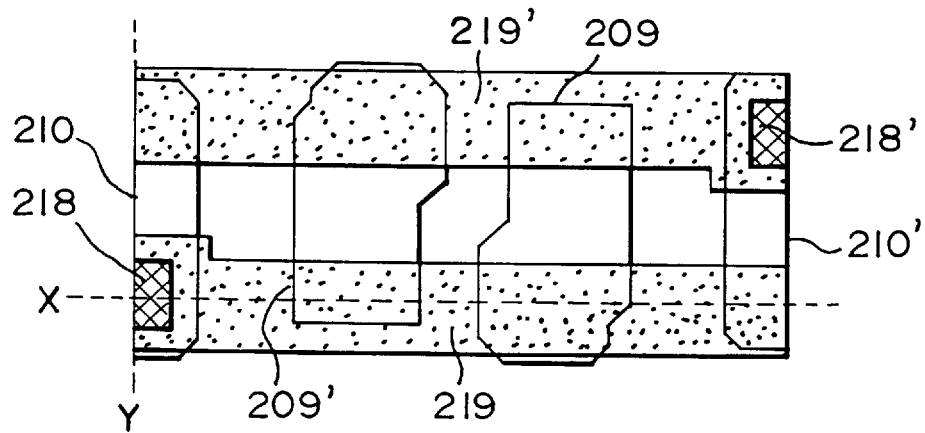
Figure 15:
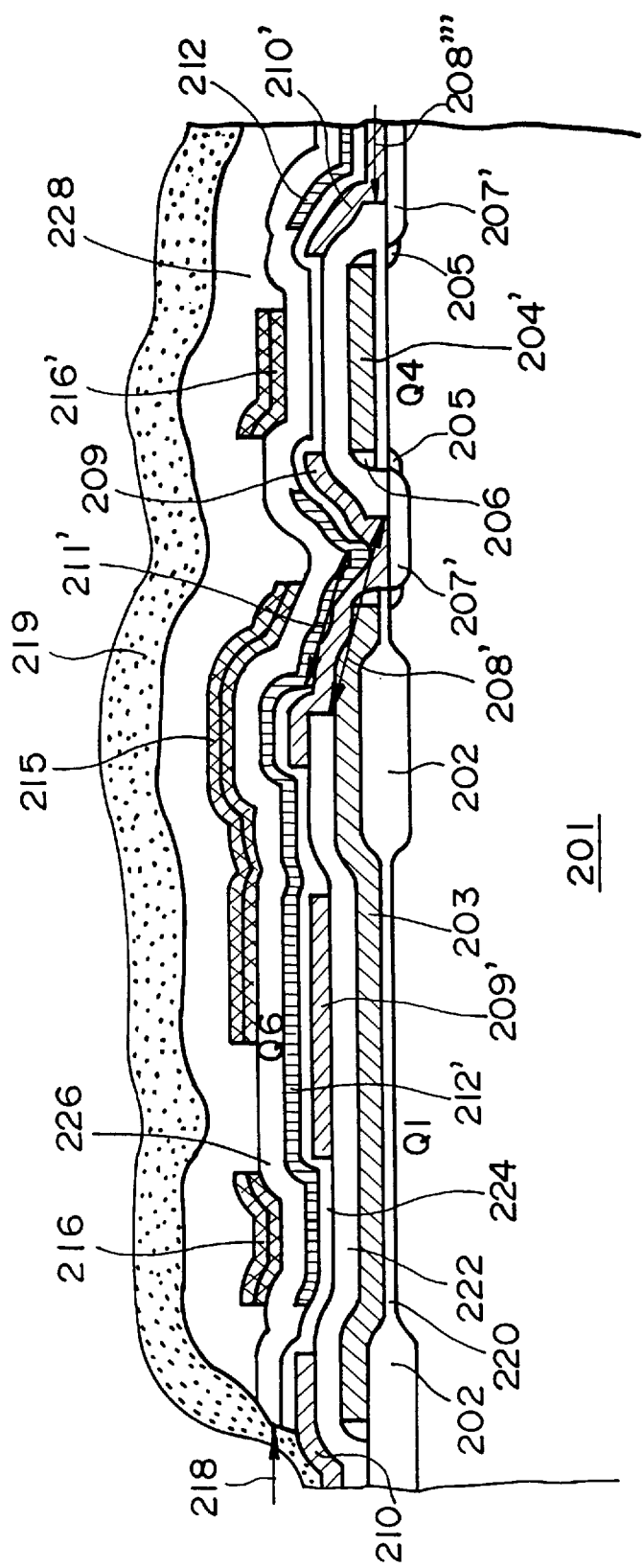
FIG. 15 is a sectional view of the memory cell of the third embodiment.
Figure 16:
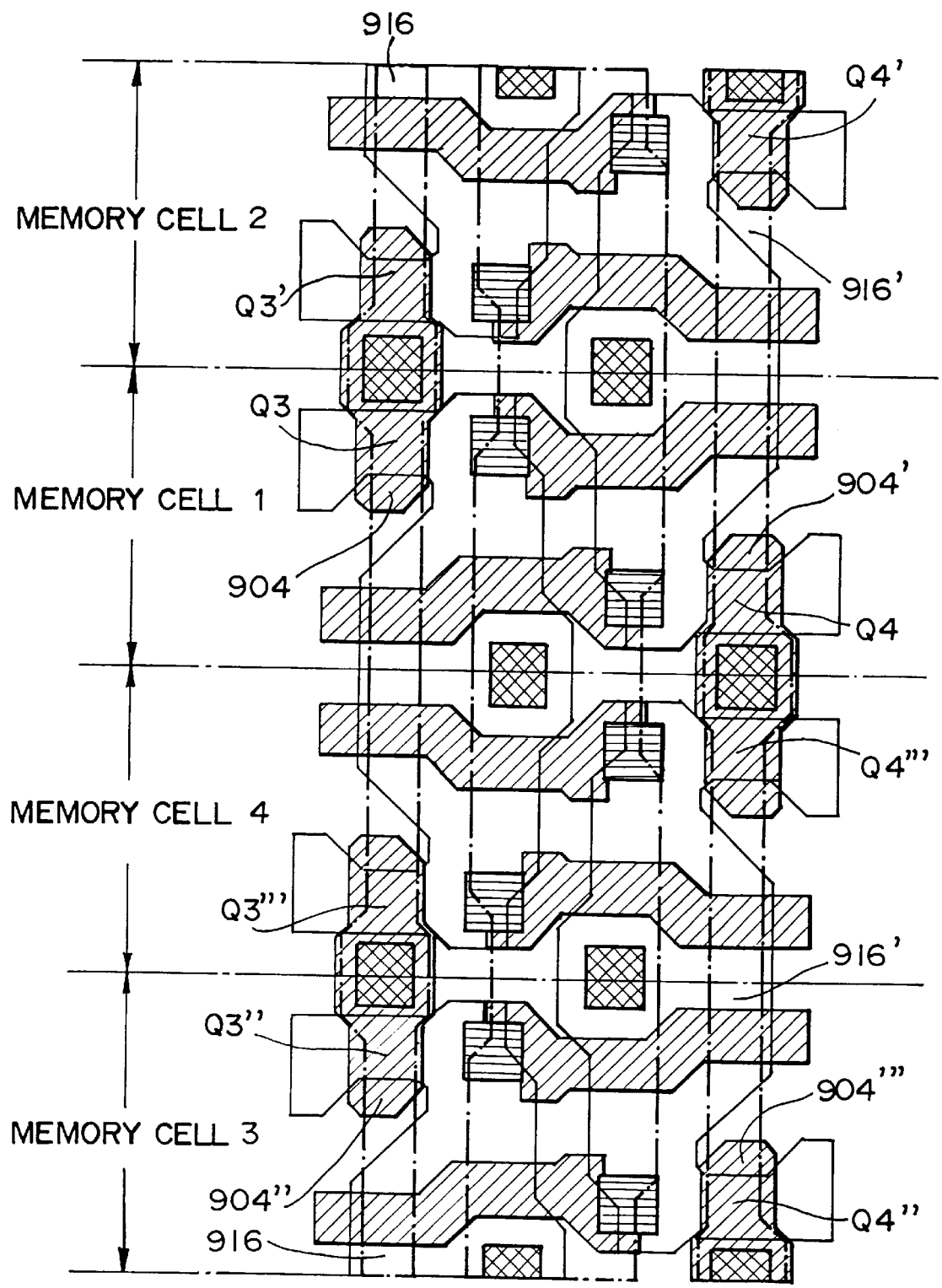
FIG. 16 is a view of an array of memory cells.
Figure 17:
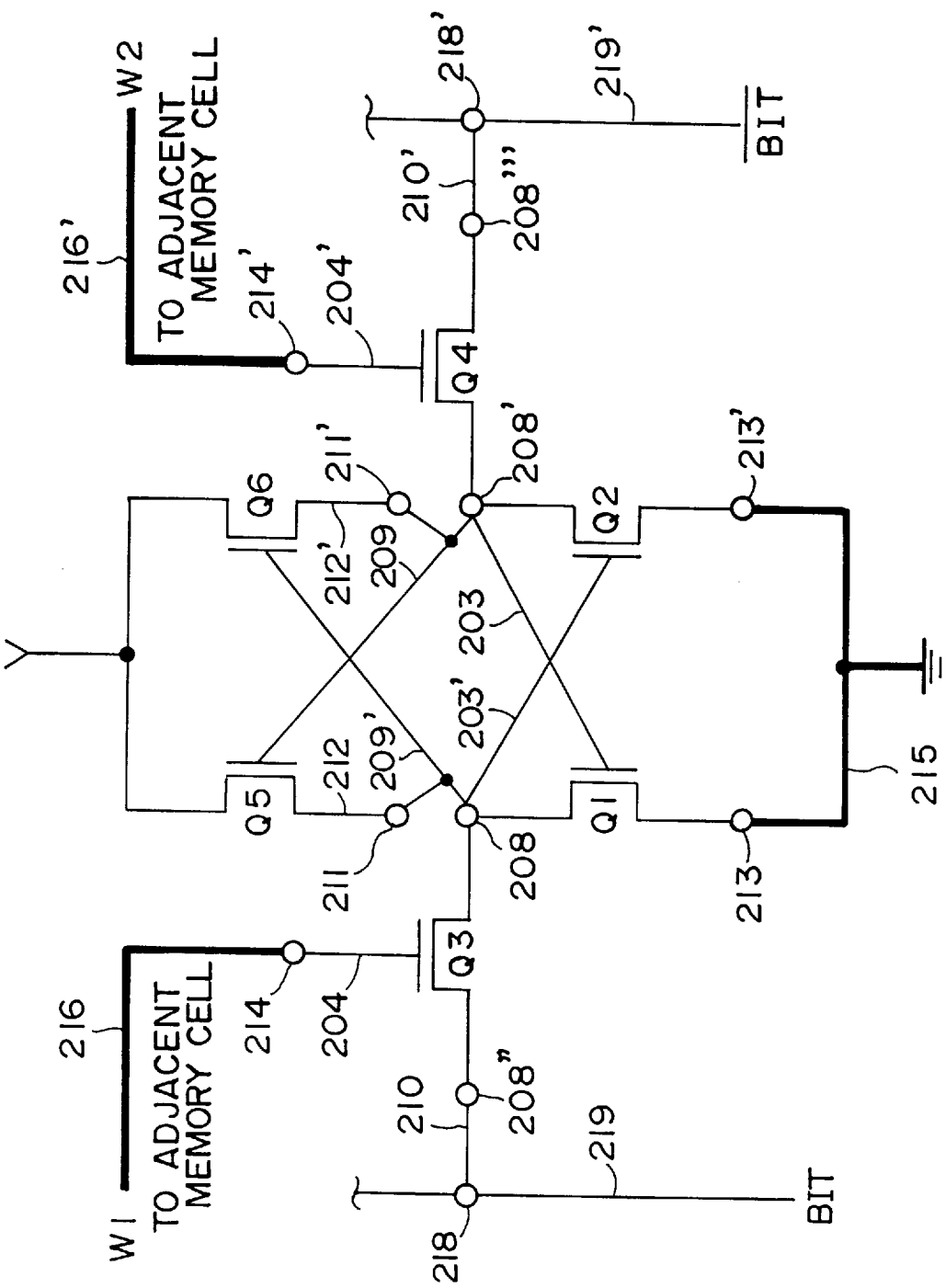
FIG. 17 is a view of an equivalent circuit in the memory cell of the third embodiment.

FIGS. 14A to 14C are plan views of a memory cell constructed in accordance with a third embodiment of the present invention, while FIG. 15 is a sectional view of the memory cell taken along a line X in FIGS. 14A to 14C. FIG. 16 shows an array of memory cells, while FIG. 17 shows an equivalent circuit used in the third embodiment. In the third embodiment, ground line 215 and first and second word lines 216, 216' are formed by a fourth wiring layer which is located above the TFTs Q5 and Q6, unlike the first embodiment.

The structure of the memory cell according to the third embodiment will be described with reference to FIG. 17 and other drawings.

In the third embodiment, a first wiring layer is formed by the gate electrodes 203, 203' of the driver transistors Q1, Q2 and the gate electrodes 204, 204' of the transfer transistors Q3, Q4.

A second wiring layer includes a gate electrode 209 of a TFT Q5, which is connected to the drain regions of the transistors Q2 and Q4 and the gate electrode of the transistor Q1 through a drain contact 208', and a gate electrode 209' of a TFT Q6, which is connected to the drain regions of the transistors Q1 and Q3 and the gate electrode of the transistor Q2 through a drain contact 208. The second wiring layer also includes bit lines having leader electrodes 210 and 210' which are connected to the source regions of the transistors Q3 and Q4 through source contacts 208'' and 208'''.

A third wiring layer includes silicon film 212 and 212' of TFTs Q5 and Q6, which are connected to the gate electrodes 209' and 209 of TFTs Q6 and Q5 respectively, through contacts 211 and 211'.

A fourth wiring layer includes a ground line 215 which is connected to the source regions of the transistors Q1 and Q2 through source contacts 213 and 213'. The fourth wiring layer also includes first and second word lines 216, 216' which are connected to the gate electrodes 204 and 204' of the transistors Q3 and Q4 through gate contacts 214 and 214'.

A fifth wiring layer includes bit lines 219 and 219' which are connected to the leader electrodes 210 and 210' of the bit lines in the second wiring layer through contacts 218 and 218'.

The process of making the memory cell will be described with reference to FIGS. 14A to 14C and 15. The manufacturing steps are similar to those of the first embodiment up to the formation of the active areas 207 and 207' and therefore the description thereof will be omitted.

(a) After the active areas have been formed, a CVD process is carried out to form an $SiO_2$ film 222 of 150 nm. A photographic process is then performed to pattern the contacts. Dry etching is then performed by RIE using $CF_4$ gas to form the drain contact 208 on the drain region of the driver transistor Q1 and the gate electrode of the driver transistor Q2, and to form the drain contact 208' on the drain region of the driver transistor Q2 and the gate electrode of the driver transistor Q1. The source contacts 208'' and 208''' are further formed on the source regions of the transfer transistors Q3 and Q4.

A polysilicon film of 150 nm is then formed using a CVD process and phosphorus as a n-type impurity is implanted at a dose of $6\times10^{15}$ $cm^{-2}$ and an acceleration rate of 35 KeV to introduce the phosphorus into the polysilicon film. A photographic process is then carried out to pattern the gate electrodes of the TFTs. Dry etching is then performed through RIE using $Cl_2$ to form the second wiring layer, that is, the gate electrodes 209, 209' of the TFTs Q5 and Q6 and the leader electrodes 210 and 210' of the bit lines.

(b) As gate films for the TFTs Q5 and Q6, an $SiO_2$ film 224 of 30 nm is formed using a CVD process, and a photographic process is then carried out to pattern the contacts. Wet etching is then performed by a hydrogen fluoride solution to form contacts 211 and 211' on the gate electrodes of the TFTs Q5 and Q6. A CVD process using $SiH_4$ gas is carried out at a pressure of 60 Pa and a temperature of 550° C. to form an amorphous silicon film of 30 nm. The photographic process is then performed to pattern the channel areas of the TFTs. $BF_2^+$ as a p-type impurity is implanted at a dose of $1\times10^{15}$ $cm^{-2}$ and an acceleration rate of 35 KeV to introduce boron into the source and drain regions of the TFTs Q5 and Q6. A photographic process is then carried out to pattern the TFT areas. Dry etching is then carried out through RIE using $Cl_2$ gas to form the third wiring layer, that is, the silicon film 212 and 212' of the TFTs Q5 and Q6. The structure of TFT may be of any one of various known forms, and thus the gate electrodes may be located above the silicon film.

(c) An $SiO_2$ film 226 of 150 nm is formed using a CVD process and a photographic process is then carried out to pattern the contacts. Subsequently, dry etching is performed through RIE using $CF_4$ gas to form source contacts 213 and 213' on N+areas that would become the source regions of the driver transistors Q1 and Q2, and to form gate contacts 214 and 214' on the gate electrodes of the transfer transistors Q3 and Q4.

A polysilicon film of 100 nm is then formed using a CVD process. Phosphorus as a n-type impurity is implanted at a dose of $6\times10^{15}$ $cm^{-2}$ and an acceleration rate of 35 KeV to introduce the phosphorus into the polysilicon film. Subsequently, sputtering is carried out to form a $WSi_2$ film, and a photographic process is then carried out to pattern the ground and word lines. Dry etching is performed through RIE using $Cl_2$ to form the fourth wiring layer, that is, the ground line 215 and word lines 216 and 216'. At this point, these lines 215, 216 and 216' are simultaneously formed.

The subsequent steps are similar to those of the first embodiment, and therefore will not be discussed further.

FIG. 16 shows an array of the memory cells formed according to the third embodiment. As in the first embodiment, the memory cells are arranged in linear symmetry about the boundary between any adjacent memory cells. The gate electrodes in the adjacent memory cells are formed into an island-like configuration by first wiring layers 904, 904', 904'' and 904''' and connected to each other through first and second word lines 916 and 916'.

Figure 18:
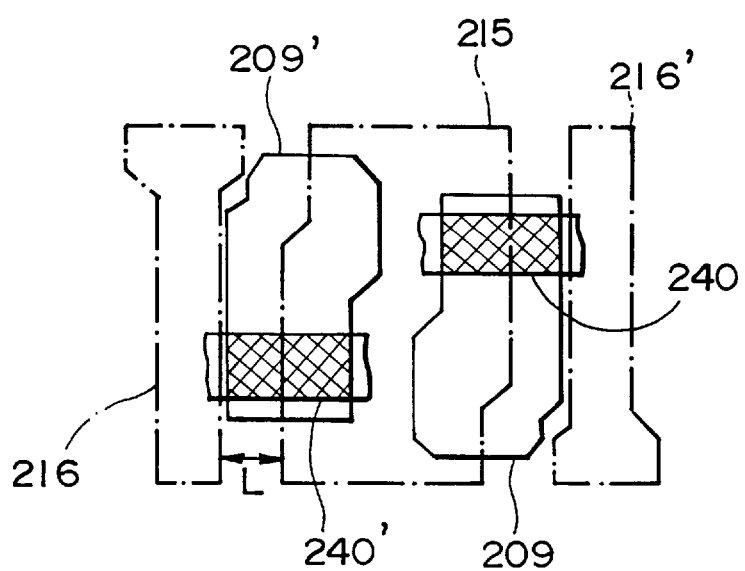
FIG. 18 is a view illustrating the relationship between a ground line and channel areas of TFTs.

In the third embodiment, a ground line 215 is disposed in such a manner as shown in FIG. 18. More particularly, the ground line 215 is disposed to cover all or part of the channel areas 240 and 240' of the TFTs (first and second load transistors), while maintaining at least the minimum spacing L between the ground line 215 and the first and second word lines 216 and 216'.

Provided that the ground line 215 is disposed in the above manner, the channel areas 240 and 240' of the TFTs can be prevented effectively from the adverse effects of an electric field and the like generated by the bit lines 219 and 219'. This structure can stabilize the operation of the memory cell and reduce the voltage required for operation. Furthermore, the TFTs can be effectively prevented from encountering the adverse effects of hydrogen and the like which are produced with the formation of a passivation film (overcoat film). Furthermore, the aspect ratio of the ground line 215 can be set at a level equal to or lower than 2.0. This can further reduce the wiring resistance in the ground line to a point lower than that of the first embodiment.

The third embodiment can also reduce the planar area of the memory cell, stabilize the operation, lower the voltage required for operation and so on by providing the wire arrangements and contact configurations as shown in FIGS. 6 to 11.

Fourth Embodiment

Figure 19A:
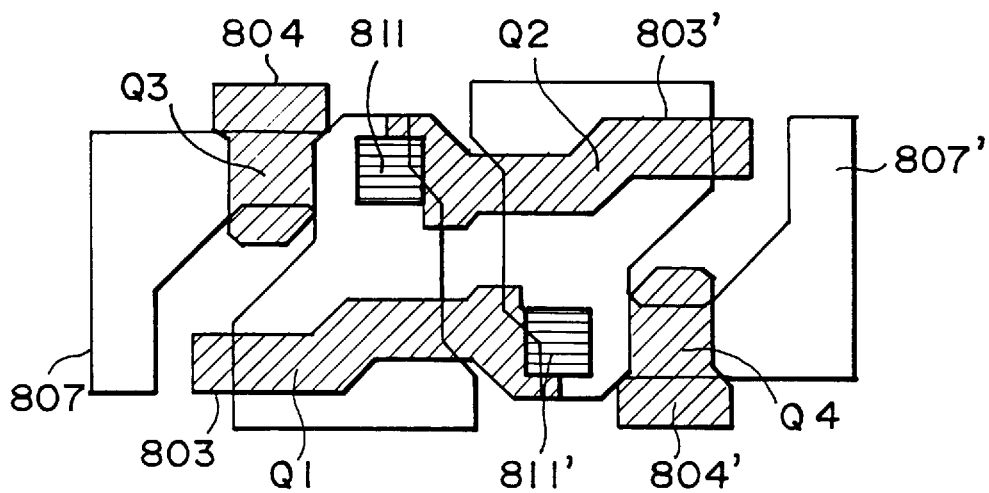
FIGS. 19A to 19C are plan views of a memory cell constructed in accordance with a fourth embodiment of the present invention.
Figure 19B:
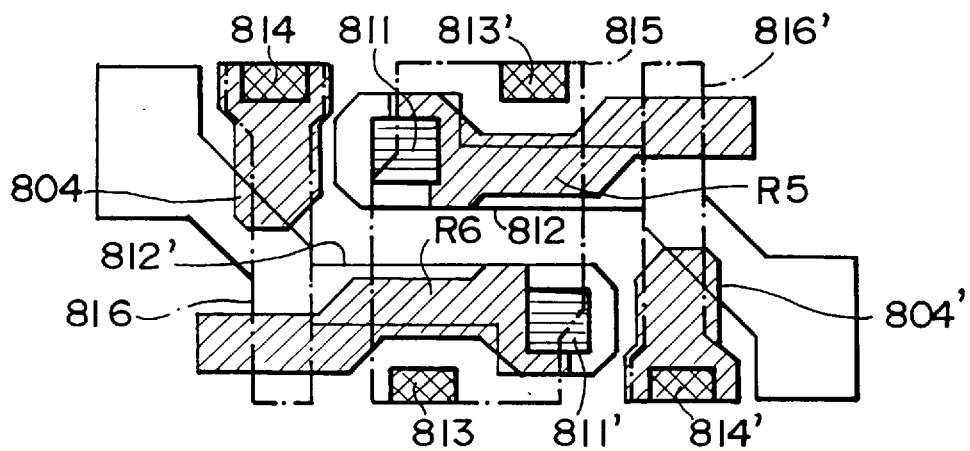
Figure 19C:
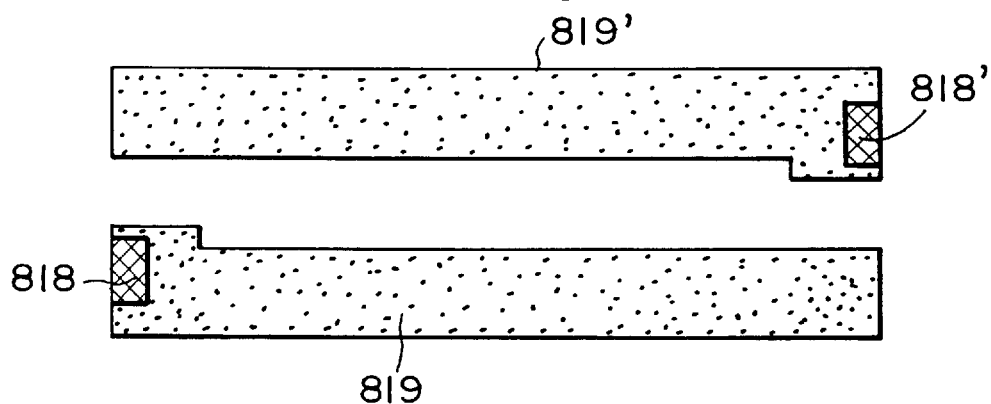

FIGS. 19A to 19C are plan views of a memory cell according to the fourth embodiment of the present invention, while FIG. 20 shows an equivalent circuit which is used therein. As is apparent from the differences between FIG. 17 and FIG. 20, the fourth embodiment uses load resistors R5 and R6 in place of the load transistors Q5 and Q6 in the third embodiment.

The structure of the memory cell according to the fourth embodiment will be described with reference to FIGS. 19A to 19C and 20. The fourth embodiment comprises a first wiring layer which includes gate electrodes 803, 803' of driver transistors Q1, Q2 and gate electrodes 804, 804' of the transfer transistors Q3, Q4.

A second wiring layer includes a load resistor 812 connected to the drain regions of the transistors Q1, Q3 and the gate electrode of the transistor Q2 through a drain contact 811, and a load resistor 812' connected to the drain regions of the transistors Q2, Q4 and the gate electrode of the transistor Q1 through a drain contact 811'.

A third wiring layer includes a ground line 815 connected to the source regions of the transistors Q1 and Q2 through source contacts 813 and 813', respectively. The third wiring layer also includes first and second word lines 816, 816' connected to the gate electrodes of the transistors Q3 and Q4 through gate contacts 814 and 814', respectively.

A fourth wiring layer includes bit lines 819 and 819' connected to the source regions of the transistors Q3 and Q4 through contacts 818 and 818', respectively.

The difference of the manufacturing process between the third and fourth embodiments is similar to that of the first and second embodiment, and therefore will not be discussed further.

The fourth embodiment can also reduce the planar area of the memory cell, stabilize the operation of the memory cell and lower the voltage required for operation, by providing the wire arrangements and contact configurations as shown in FIGS. 6 to 11 and 18. Particularly, the load resistors 812 and 812' in the second wiring layer can be effectively prevented from encountering the adverse effects generated by the electric field and the like of bit lines 819 and 819', by shielding the load resistors 812 and 812' with the ground line 815 in the third wiring layer.

Figure 22:
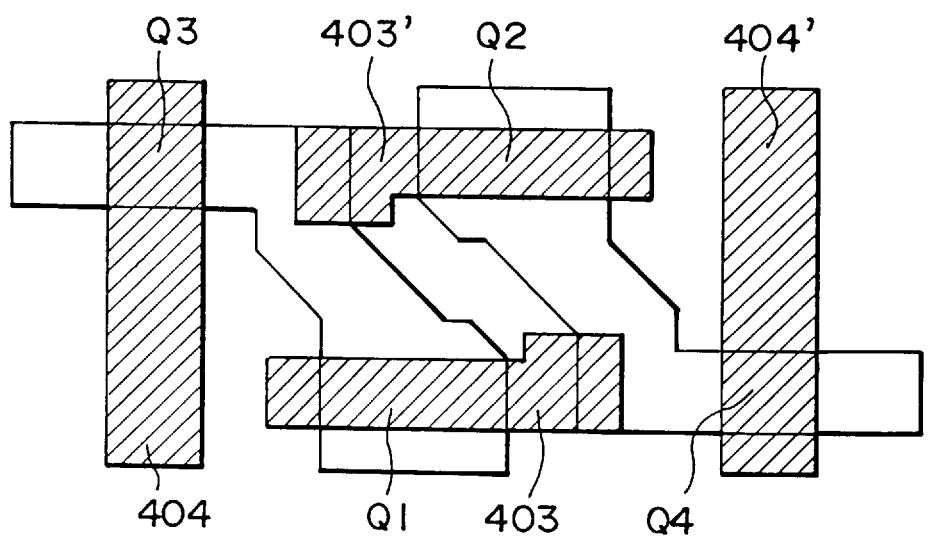
FIG. 22 is a view of another memory cell constructed in accordance with the prior art.

Since the gate electrodes of the transfer transistors are located in the wiring layer different from that of the word lines, the first to fourth embodiments can reduce the cell size more than the prior art shown in FIG. 22.

Since the ground line of the memory cell is formed by the same wiring layer as the word lines, the number of wiring layers required is less than the number of layers required for the devices of the prior art of FIG. 24. Furthermore, the ground line which is in the same wiring layer as the word lines can be disposed between two word lines, and the aspect ratio of the ground line can be reduced. Thus, it is possible to reduce the number of wiring layers, while stabilizing the low-voltage operation of the memory cell.

Figure 23:
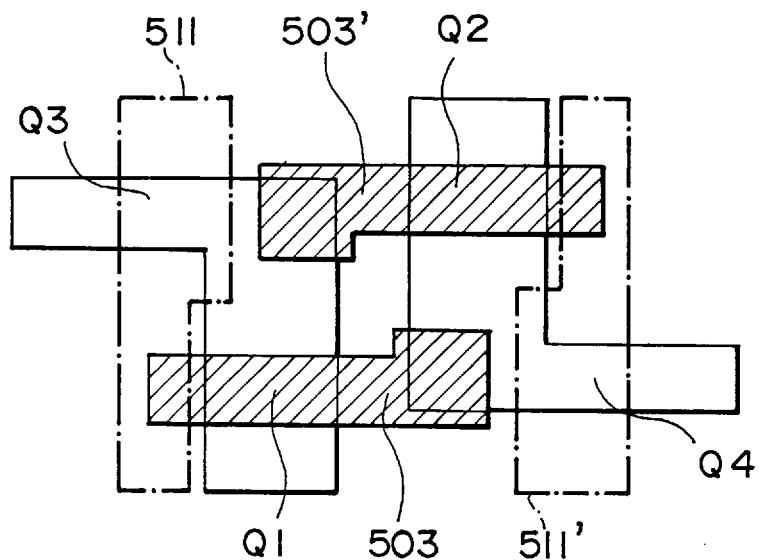
FIG. 23 is a view of still another memory cell constructed in accordance with the prior art.

Comparison of the number of manufacturing steps of the gate films of the transistors Q1, Q2, Q3 and Q4 up to the word lines with SSW cell of FIG. 23 (the number of manufacturing steps of the gate films of the pull-down transistors up to the access transistors, when the Access transistors comprise the sidewalls of $SiO_2$) indicates that the present embodiment eliminates a step in the respective CVD $SiO_2$ deposition and plasma $SiO_2$ etch-back.

Furthermore, in the SSW cell the gate electrode of the access transistor (transfer transistor) is formed of polycide. When the gate oxide film is formed of a thickness less than 10 nm to improve the capabilities of the access transistor, the gate oxide film may be scooped out or an undercut may be created in the polycide during the etching of the polycide. To overcome such problems, the gate oxide films of the transistors Q1, Q2, Q3 and Q4 are formed of polysilicon in the memory cell of the present embodiment. It is easier to etch polysilicon than polycide. Furthermore, although the ground and word lines are formed of polycide, the etching can be carried out easily because of the interlaminar film below the polycide which has a relatively large thickness of 150 nm. Additionally, in the present invention polycide is not used as part of the transistors and eliminates any undercutting, thus facilitating the etching.

When polycide is utilized in the transistors and when a pre-washing step before a WSi sputtering step does not remove all impurities, impurities will be accumulated on the interface between the polysilicon and the WSi film. Consequently, the polycide cannot be etched sufficiently due to these impurities, and this poor etching lowers the yield. The present embodiment is free from such problems relating to the wiring layer of the first layer, and therefore, the yield can be improved.

The present invention is not limited to the aforementioned four embodiments, but may be embodied in various modifications.

Figure 21:
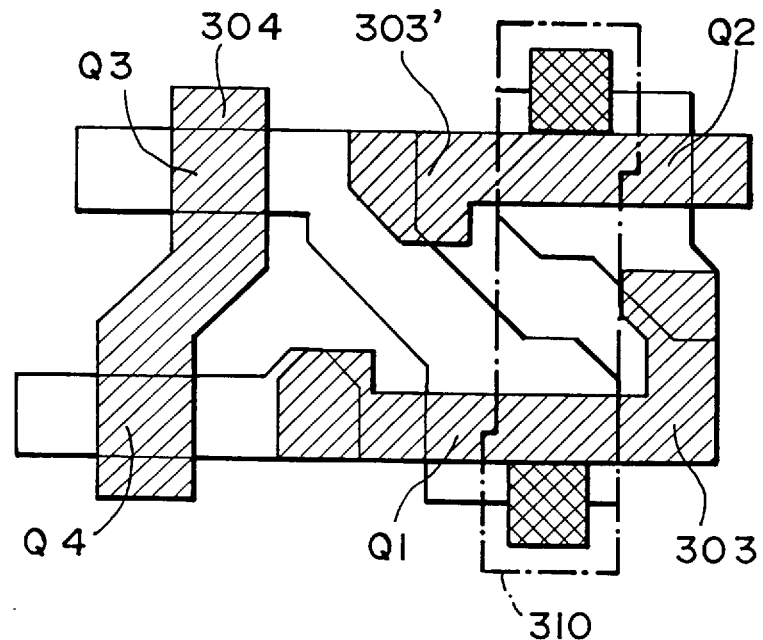
FIG. 21 is a view of a memory cell constructed in accordance with the prior art.

In the present embodiments, for example, the gate electrodes of the MOS-type and transfer transistors in the flip-flop circuit are formed of a polycrystalline silicon film being the first wiring layer and the ground and word lines are formed of WSi polycide. However, the ground and word lines of the memory cell may be formed of any other low-resistant and high-melting metal material such as polycide or silicide of Mo, Co, Ni, Ta and the like. Alternatively, the ground and word lines may be formed of a metal wire. If the ground and word lines of the memory cell have a low resistance, the gate electrodes of the MOS-type and transfer transistors in the flip-flop circuit may be formed of any material having a slightly higher resistance (50–1000 $\Omega/\square$) such as the polycrystalline silicon film in the present embodiments. In the general SRAM memory as shown in FIG. 21, it is required that the word lines in the first layer and the ground line in the second layer have a low resistance. Therefore, two high-melting metal polycide wiring layers are required. On the contrary, the present embodiments can decrease the number of polycide wiring layers by one to reduce the number of necessary manufacturing steps and also to improve the yield.

The configuration and other features of the wirings and contacts shown in FIGS. 6 to 11 and 18 are particularly effective for decreasing the planar area of the memory cell, stabilizing the operation and lowering the voltage required for operation in the structures described relating to the four embodiments. However, the present invention may be applied to any other memory cell structures as long as gate electrodes of transfer transistors are connected through a wiring layer different from the wiring layer including the gate electrodes.

We claim:

1. A semiconductor memory device comprising memory cells each of which has a flip-flop circuit including first and second driver transistors, and first and second transfer transistors, comprising:

a first word line for connecting gate electrodes of said first transfer transistors in said memory cells, the first word line being formed by a wiring layer different from a wiring layer which forms said gate electrodes of said first transfer transistors;

a second word line for connecting gate electrodes of said second transfer transistors in said memory cells, the second word line being formed by a wiring layer different from the wiring layer which forms said gate electrodes of said second transfer transistors;

a ground line for connecting source regions of said first and second driver transistors;

a first drain contact for connecting drain regions of said first driver and transfer transistors to the gate electrode of said second driver transistor; and a second drain contact for connecting drain regions of said second driver and transfer transistors to the gate electrode of said first driver transistor;

wherein said first drain contact has a first chamfered side which is formed by chamfering a corner facing said second drain contact, and said second drain contact has a second chamfered side which is formed by chamfering a corner facing said first drain contact.

2. The semiconductor memory device according to claim 1, wherein the wiring layer forming said first and second word lines and said ground line is a second wiring layer located above the wiring layer forming the gate electrodes of said first and second transfer transistors, which is a first wiring layer.

3. The semiconductor memory device according to claim 2, wherein said ground line covers at least a part of channel areas of said first and second driver transistors, while maintaining at least a minimum spacing between said ground line and said first word line and between said ground line and said second word line.

4. The semiconductor memory device according to claim 3, wherein said flip-flop circuit includes one of first and second load transistors and first and second load resistors, and wherein said ground line is disposed one of between the channel areas of said first and second load transistors and the channel areas of said second and first driver transistors and between said first and second load resistors and the channel areas of said second and first driver transistors.

5. The semiconductor memory device according to claim 1, wherein said flip-flop circuit includes one of first and second load transistors and first and second load resistors, and wherein the wiring layer forming said first and second word lines and said ground line is one of a third and fourth wiring layer above one of said first and second load transistors and said first and second load resistors.

6. The semiconductor memory device according to claim 5, wherein said ground line covers one of at least a portion of the channel areas of said first and second load transistors and at least a portion of said first and second load resistors, while maintaining at least a minimum spacing between said ground line and said first word line and between said ground line and said second word line.

7. The semiconductor memory device according to claim 1, wherein said ground line is located in an area between said first and second chamfered sides.

8. The semiconductor memory device according to claim 7, wherein said ground line includes a side which is opposite and parallel to said first chamfered side and a side which is opposite and parallel to said second chamfered side.

9. The semiconductor memory device according to claim 1, wherein said flip-flop circuit comprises:

first and second load transistors;

the drain regions of said first driver and transfer transistors being connected to the gate electrode of said second load transistor which is connected to the gate electrode of said second driver transistor; and the drain regions of said second driver and transfer transistors being connected to the gate electrode of said first load transistor which is connected to the gate electrode of said first driver transistor.

10. A semiconductor memory device comprising memory cells each of which has a flip-flop circuit including first and second driver transistors, and first and second transfer transistors, comprising:

a first word line for connecting gate electrodes of said first transfer transistors in said memory cells, the first word line being formed by a wiring layer different from a wiring layer which forms said gate electrodes of said first transfer transistors;

a second word line for connecting gate electrodes of said second transfer transistors in said memory cells, the second word line being formed by a wiring layer different from the wiring layer which forms said gate electrodes of said second transfer transistors;

a ground line for connecting source regions of said first and second driver transistors;

a first source contact for connecting the source region of said first driver transistor to said ground line;

a second source contact for connecting a source region of said second driver transistor to said ground line;

a first drain contact for connecting the drain regions of said first driver and transfer transistor to the gate electrode of said second driver transistor and a second drain contact for connecting drain regions of said second driver and transfer transistors to the gate electrode of said first driver transistor;

wherein said first source and drain contacts are disposed separately and have a given spacing therebetween along a first direction approximately parallel to said first and second word lines;

said second source and drain contacts are disposed separately located and have a given spacing therebetween along a second direction parallel to the first direction; and said ground line is disposed at a position to include said first and second source contacts while maintaining at least a minimum spacing between said ground line and said first drain contact and between said ground line and said second drain contact.

11. The semiconductor memory device according to claim 1, further comprising:

a first source contact for connecting the source region of said first driver transistor to said ground line; and a second source contact for connecting the source region of said second driver transistor to said ground line;

wherein the gate electrode of said first driver transistor is angled around said first source contact to maintain at least a minimum spacing between the gate electrode of said first driver transistor and respective sides of said first source contact; and the gate electrode of said second driver transistor is angled around said second source contract to maintain at least a minimum spacing between the gate electrode of said second driver transistor and respective sides of said second source contract.

12. The semiconductor memory device according to claim 1, wherein the gate electrodes of said first and second driver and transfer transistors are formed of silicon film, and wherein said first and second word lines and said ground line are formed of a material different from said silicon film.

13. The semiconductor memory device according to claim 10, wherein the gate electrodes of said first and second driver and transfer transistors are formed of silicon film, and wherein said word and ground lines are formed of a material different from said silicon film.

14. A semiconductor memory device comprising memory cells each of which has a flip-flop circuit including first and second driver transistors, and first and second transfer transistors, comprising:

a first word line for connecting gate electrodes of said first transfer transistors in said memory cells, the first word line being formed by a wiring layer different from a wiring layer which forms said gate electrodes of said first transfer transistors;

a second word line for connecting gate electrodes of said second transfer transistors in said memory cells, the second word line being formed by a wiring layer different from the wiring layer which forms said gate electrodes of said second transfer transistors;

a ground line for connecting source regions of said first and second driver transistors, the ground line being formed by a wiring layer identical with the wiring layer which forms said first and second word lines:

wherein said memory cells are disposed in linear symmetry about a boundary between adjacent memory cells, and wherein the gate electrode of said first transfer transistor in a first memory cell and the gate electrode of a first transfer transistor in a first adjacent memory cell are formed into a first island-like configuration, which is shared by said gate electrodes of said first transfer transistors, and the gate of said second transfer in a second memory cell and the gate electrode of a second transfer transistor in a second adjacent memory cell are formed into second island-like configuration, which is shared by said gate electrodes of said second transfer transistors.

15. The semiconductor memory device according to claim 1, wherein said memory cells are disposed in linear symmetry about a boundary between adjacent memory cells, and wherein the gate electrode of said first transfer transistor in a first memory cell and the gate electrode of a first transfer transistor in a first adjacent memory cell are formed into a first island-like configuration, which is shared by said gate electrodes of said first transfer transistors, and the gate of said second transfer in a second memory cell and the gate electrode of a second transfer transistor in a second adjacent memory cell are formed into second island-like configuration, which is shared by said gate electrodes of said second transfer transistors.

16. The semiconductor memory device according to claim 10, wherein said memory cells are disposed in linear symmetry about a boundary between adjacent memory cells, and wherein the gate electrode of said first transfer transistor in a first memory cell and the gate electrode of a first transfer transistor in a first adjacent memory cell are formed into a first island-like configuration, which is shared by said gate electrodes of said first transfer transistors, and the gate of said second transfer in a second memory cell and the gate electrode of a second transfer transistor in a second adjacent memory cell are formed into second island-like configuration, which is shared by said gate electrodes of said second transfer transistors.

17. The semiconductor memory device according to claim 1, wherein said ground line has a first portion which is located in an area between said first and second drain contacts and second portions which are located in areas on first and second source contacts for connecting the source regions of said first and second driver transistors to said ground line, the width of said first portion of said ground line being narrower than the width of said second portions of said ground line.

18. The semiconductor memory device according to claim 10, wherein said ground line has a first portion which is located in an area between said first and second drain contacts and second portions which are located in areas on said first and second source contacts, the width of said first portion of said ground line being narrower than the width of said second portions of said ground line.

19. The semiconductor memory device according to claim 1, wherein said ground line being formed by a wiring layer identical with the wiring layer which forms said first and second word lines.

20. The semiconductor memory device according to claim 10, wherein said ground line being formed by a wiring layer identical with the wiring layer which forms said first and second word lines.

21. The semiconductor memory device according to claim 10, wherein the wiring layer forming said first and second word lines and said ground line is a second wiring layer located above the wiring layer forming the gate electrodes of said first and second transfer transistors, which is a first wiring layer.

22. The semiconductor memory device according to claim 21, wherein said ground line covers at least a part of channel areas of said first and second driver transistors, while maintaining at least a minimum spacing between said ground line and said first word line and between said ground line and said second word line.

23. The semiconductor memory device according to claim 22, wherein said flip-flop circuit includes one of first and second load transistors and first and second load resistors, and wherein said ground line is disposed between one of the channel areas of said first and second load transistors and the channel areas of said second and first driver transistors and between said first and second load resistors and the channel areas of said second and first driver transistors.

24. The semiconductor memory device according to claim 10, wherein said flip-flop circuit includes one of first and second load transistors and fist and second load resistors, and wherein the wiring layer forming said first and second word lines and said ground line is one of a third and fourth wiring layer above one of said first and second load transistors and said first and second load resistors.

25. The semiconductor memory device according to claim 24, wherein said ground line covers one of a portion of the channel areas of said first and second load transistors and a portion of said first and second load resistors, while maintaining at least a minimum spacing between said ground line and said first word line and between said ground line and said second word line.

26. The semiconductor memory device according to claim 10, further comprising:

a first source contact for connecting the source region of said first driver transistor to said ground line; and a second source contact for connecting the source region of said second driver transistor to said ground line;

wherein the gate electrode of said first driver transistor is angled around said first source contact to maintain at least a minimum spacing between the gate electrode of said first driver transistor and respective sides of said first source contact; and the gate electrode of said second driver transistor is angled around said second source contract to maintain at least a minimum spacing between the gate electrode of said second driver transistor and respective sides of said second source contract.

* * * * *